United States Patent
Hoff

(10) Patent No.: US 11,531,936 B2
(45) Date of Patent: Dec. 20, 2022

(54) SYSTEM AND METHOD FOR EMPIRICAL ELECTRICAL-SPACE-HEATING-BASED ESTIMATION OF OVERALL THERMAL PERFORMANCE OF A BUILDING

(71) Applicant: Clean Power Research, L.L.C., Napa, CA (US)

(72) Inventor: Thomas E. Hoff, Napa, CA (US)

(73) Assignee: CLEAN POWER RESEARCH, L.L.C., Napa, CA (US)

(*) Notice: Subject to any disclaimer, the term of this patent is extended or adjusted under 35 U.S.C. 154(b) by 259 days.

(21) Appl. No.: 16/828,760

(22) Filed: Mar. 24, 2020

(65) Prior Publication Data
US 2020/0240851 A1     Jul. 30, 2020

Related U.S. Application Data

(63) Continuation of application No. 16/036,832, filed on Jul. 16, 2018, now Pat. No. 10,670,477, which is a
(Continued)

(51) Int. Cl.
*G01K 3/08* (2006.01)
*G01R 21/02* (2006.01)
(Continued)

(52) U.S. Cl.
CPC ........... *G06Q 10/0631* (2013.01); *G01K 3/08* (2013.01); *G01K 17/20* (2013.01); *G01R 21/02* (2013.01); *G06Q 50/06* (2013.01); *G01K 13/00* (2013.01)

(58) Field of Classification Search
CPC ........ G01R 21/02; G01K 13/00; G01K 17/20; G01K 3/08; G06Q 10/0631; G06Q 50/06; Y02P 90/82
See application file for complete search history.

(56) References Cited

U.S. PATENT DOCUMENTS

| 3,923,038 A | 12/1975 | Cutchaw |
| 4,089,143 A | 5/1978 | La Pietra |
| (Continued) | | |

FOREIGN PATENT DOCUMENTS

| WO | 2007124059 | 1/2007 |
| WO | 2007142693 | 12/2007 |
| (Continued) | | |

OTHER PUBLICATIONS

Brinkman et al., "Toward a Solar-Powered Grid." IEEE Power & Energy, vol. 9, No. 3, May/Jun. 2011.
(Continued)

*Primary Examiner* — Catherine T. Rastovski
(74) *Attorney, Agent, or Firm* — Patrick J. S. Inouye; Leonid Kisselev

(57) ABSTRACT

The overall thermal performance of a building $UA^{Total}$ can be empirically estimated through a short-duration controlled test. Preferably, the controlled test is performed at night during the winter. A heating source is turned off after the indoor temperature has stabilized. After an extended period, such as 12 hours, the heating source is briefly turned back on, such as for an hour, then turned off. The indoor temperature is allowed to stabilize. The energy consumed within the building during the test period is assumed to equal internal heat gains. Overall thermal performance is estimated by balancing the heat gained with the heat lost during the test period.

16 Claims, 10 Drawing Sheets

Related U.S. Application Data continuation of application No. 14/294,087, filed on Jun. 2, 2014, now Pat. No. 10,024,733.

(60) Provisional application No. 61/935,285, filed on Feb. 3, 2014.

(51) Int. Cl.
*G01K 17/20* (2006.01)
*G06Q 10/06* (2012.01)
*G06Q 50/06* (2012.01)
*G01K 13/00* (2021.01)

(56) References Cited

U.S. PATENT DOCUMENTS

| | | |
|---|---|---|
| 4,992,942 A | 2/1991 | Bauerle et al. |
| 5,001,650 A | 3/1991 | Francis et al. |
| 5,177,972 A | 1/1993 | Sillato et al. |
| 5,602,760 A | 2/1997 | Chacon et al. |
| 5,803,804 A | 9/1998 | Meier et al. |
| 6,134,511 A | 10/2000 | Subbarao |
| 6,148,623 A | 11/2000 | Park et al. |
| 6,366,889 B1 | 4/2002 | Zaloom |
| 6,748,327 B1 | 6/2004 | Watson |
| 7,451,017 B2 | 11/2008 | McNally |
| 7,742,897 B2 | 6/2010 | Herzig |
| 7,920,997 B2 | 4/2011 | Domijan et al. |
| 8,090,477 B1* | 1/2012 | Steinberg .............. F24F 11/62 700/278 |
| 8,155,900 B1* | 4/2012 | Adams .............. G06F 17/00 702/62 |
| 8,369,994 B1 | 2/2013 | Rosen |
| 9,007,460 B2 | 1/2015 | Schmidt et al. |
| 9,020,650 B2 | 4/2015 | Lutze |
| 9,086,585 B2 | 7/2015 | Hamada et al. |
| 9,098,876 B2 | 8/2015 | Steven et al. |
| 9,103,719 B1 | 8/2015 | Ho et al. |
| 9,171,276 B2 | 10/2015 | Steven et al. |
| 9,286,464 B2 | 3/2016 | Choi |
| 9,524,529 B2 | 12/2016 | Sons et al. |
| 2002/0055358 A1 | 5/2002 | Hebert |
| 2005/0055137 A1 | 3/2005 | Andren et al. |
| 2005/0222715 A1* | 10/2005 | Ruhnke .............. F24F 11/30 237/2 A |
| 2007/0084502 A1 | 4/2007 | Kelly et al. |
| 2007/0119718 A1 | 5/2007 | Gibson et al. |
| 2008/0258051 A1 | 10/2008 | Heredia et al. |
| 2009/0125275 A1 | 5/2009 | Woro |
| 2009/0154384 A1 | 6/2009 | Todd et al. |
| 2009/0217965 A1 | 9/2009 | Dougal et al. |
| 2009/0302681 A1 | 12/2009 | Yamada et al. |
| 2010/0161502 A1 | 6/2010 | Kumazawa et al. |
| 2010/0188413 A1 | 7/2010 | Hao et al. |
| 2010/0198420 A1 | 8/2010 | Rettger et al. |
| 2010/0211222 A1* | 8/2010 | Ghosn .............. G01K 17/00 702/182 |
| 2010/0219983 A1 | 9/2010 | Peleg et al. |
| 2010/0309330 A1 | 12/2010 | Beck |
| 2010/0332373 A1 | 12/2010 | Crabtree et al. |
| 2011/0137591 A1 | 6/2011 | Ishibashi |
| 2011/0137763 A1 | 6/2011 | Aguilar |
| 2011/0272117 A1 | 11/2011 | Hamstra et al. |
| 2011/0276269 A1 | 11/2011 | Hummel |
| 2011/0282504 A1 | 11/2011 | Besore et al. |
| 2011/0307109 A1 | 12/2011 | Sri-Jayantha |
| 2012/0078685 A1 | 3/2012 | Krebs et al. |
| 2012/0130556 A1 | 5/2012 | Marhoefer |
| 2012/0143383 A1 | 6/2012 | Cooperrider et al. |
| 2012/0158350 A1 | 6/2012 | Steinberg et al. |
| 2012/0191439 A1 | 7/2012 | Meagher et al. |
| 2012/0278051 A1 | 11/2012 | Jiang et al. |
| 2012/0310416 A1 | 12/2012 | Tepper et al. |
| 2012/0310427 A1 | 12/2012 | Williams et al. |
| 2012/0330626 A1 | 12/2012 | An et al. |
| 2013/0008224 A1 | 1/2013 | Stormbom |
| 2013/0030590 A1 | 1/2013 | Prosser |
| 2013/0054662 A1 | 2/2013 | Coimbra |
| 2013/0060471 A1 | 3/2013 | Aschheim et al. |
| 2013/0152998 A1 | 6/2013 | Herzig |
| 2013/0166266 A1 | 6/2013 | Herzig et al. |
| 2013/0204439 A1 | 8/2013 | Scelzi |
| 2013/0245847 A1 | 9/2013 | Steven et al. |
| 2013/0262049 A1 | 10/2013 | Zhang et al. |
| 2013/0268129 A1 | 10/2013 | Fadell et al. |
| 2013/0274937 A1 | 10/2013 | Ahn et al. |
| 2013/0289774 A1 | 10/2013 | Day et al. |
| 2013/0314699 A1 | 11/2013 | Jungerman et al. |
| 2014/0039709 A1 | 2/2014 | Steven et al. |
| 2014/0039965 A1 | 2/2014 | Steven et al. |
| 2014/0107851 A1 | 4/2014 | Yoon et al. |
| 2014/0129197 A1 | 5/2014 | Sons et al. |
| 2014/0142862 A1 | 5/2014 | Umeno et al. |
| 2014/0214222 A1 | 7/2014 | Rouse et al. |
| 2014/0222241 A1* | 8/2014 | Ols .............. F24F 11/70 700/299 |
| 2014/0278108 A1 | 9/2014 | Kerrigan et al. |
| 2015/0019034 A1 | 1/2015 | Gonatas |
| 2015/0057820 A1 | 2/2015 | Kefayati et al. |
| 2015/0088576 A1 | 3/2015 | Steven et al. |
| 2015/0094968 A1 | 4/2015 | Jia et al. |
| 2015/0112497 A1 | 4/2015 | Steven et al. |
| 2015/0134251 A1 | 5/2015 | Bixel |
| 2015/0177415 A1 | 6/2015 | Bing |
| 2015/0188415 A1 | 7/2015 | Abido et al. |
| 2015/0278968 A1 | 10/2015 | Steven et al. |
| 2015/0326015 A1 | 11/2015 | Steven et al. |
| 2016/0049606 A1 | 2/2016 | Bartoli et al. |
| 2016/0072287 A1 | 3/2016 | Jia et al. |
| 2016/0187911 A1 | 6/2016 | Carty et al. |
| 2016/0306906 A1 | 10/2016 | McBrearty et al. |
| 2017/0104451 A1 | 4/2017 | Gostein |

FOREIGN PATENT DOCUMENTS

| | | |
|---|---|---|
| WO | 2013181408 | 12/2013 |
| WO | 2014081967 | 5/2014 |

OTHER PUBLICATIONS

California ISO. Summary of Preliminary Results of 33% Renewable Integration Study—2010 CPUC LTPP. May 10, 2011.

Ellis et al., "Model Makers." IEEE Power & Energy, vol. 9, No. 3, May/Jun. 2011.

Danny H.W. Li et al., "Analysis of solar heat gain factors using sky clearness index and energy implications." Energy Conversions and Management, Aug. 2000.

Hoff et al., "Quantifying PV Power Output Variability." Solar Energy 84 (2010) 1782-1793, Oct. 2010.

Hoff et al., "PV Power Output Variability: Calculation of Correlation Coefficients Using Satellite Insolation Data." American Solar Energy Society Annual Conference Proceedings, Raleigh, NC, May 18, 2011.

Kuszamaul et al., "Lanai High-Density Irradiance Sensor Network for Characterizing Solar Resource Variability of MW-Scale PV System." 35th Photovoltaic Specialists Conference, Honolulu, HI. Jun. 20-25, 2010.

Serban C. "Estimating Clear Sky Solar Global Radiation Using Clearness Index, for Brasov Urban Area". Proceedings of the 3rd International Conference on Maritime and Naval Science and Engineering. ISSN: 1792-4707, ISBN: 978-960-474-222-6.

Mills et al., "Dark Shadows." IEEE Power & Energy, vol. 9, No. 3, May/Jun. 2011.

Mills et al., "Implications of Wide-Area Geographic Diversity for Sort-Term Variability of Solar Power." Lawrence Berkeley National Laboratory Technical Report LBNL-3884E. Sep. 2010.

Perez et al., "Parameterization of site-specific short-term irradiance variability." Solar Energy, 85 (2011) 1343-1345, Nov. 2010.

Perez et al., "Short-term irradiance variability correlation as a function of distance." Solar Energy, Mar. 2011.

(56) References Cited

OTHER PUBLICATIONS

Philip, J., "The Probability Distribution of the Distance Between Two Random Points in a Box." www.math.kth.se/~johanph/habc.pdf. Dec. 2007.
Stein, J., "Simulation of 1-Minute Power Output from Utility-Scale Photovoltaic Generation Systems." American Solar Energy Society Annual Conference Proceedings, Raleigh, NC, May 18, 2011.
Solar Anywhere, 2011. Web-Based Service that Provides Hourly, Satellite-Derived Solar Irradiance Data Forecasted 7 days Ahead and Archival Data back to Jan. 1, 1998. www.SolarAnywhere.com.
Stokes et al., "The atmospheric radiance measurement (ARM) program: programmatic background and design of the cloud and radiation test bed." Bulletin of American Meteorological Society vol. 75, No. 7, pp. 1201-1221, Jul. 1994.
Hoff et al., "Modeling PV Fleet Output Variability," Solar Energy, May 2010.
Olopade et al., "Solar Radiation Characteristics and the performance of Photovoltaic (PV) Modules in a Tropical Station." Journal Sci. Res. Dev. vol. 11, 100-109, 2008/2009.
Li et al., "Analysis of solar heat gain factors using sky clearness index and energy implications." 2000.
Shahab Poshtkouhi et al., "A General Approach for Quantifying the Benefit of Distributed Power Electronics for Fine Grained MPPT in Photovoltaic Applications Using 3-D Modeling," Nov. 20, 2012, IEE Transactions on Poweer Electronics, vol. 27, No. 11, p. 4656-4666, 2012.
Pathomthat Chiradeja et al., "An Approaching to Quantify the Technical Benefits of Distributed Generation," Dec. 2004, IEEE Transactions on Energy Conversation, vol. 19, No. 4, p. 764-773, 2004.
Mudathir Funsho Akorede et al., "Distributed Energy Resources and Benefits to the Environment," 2010, Renewable and Sustainable Energy Reviews 14, p. 724-734.
V.H. Mendez, et al., "Impact of Distributed Generation on Distribution Investment Deferral," Electrical Power and Energy Systems 28, p. 244-252, 2006.
Francisco M. Gonzalez-Longatt et al., "Impact of Distributed Generation Over Power Losses on Distribution System," Oct. 2007, Electrical Power Quality and Utilization, 9th International Conference.
M. Begovic et al., "Impact of Renewable Distributed Generation on Power Systems," 2001, Proceedings of the 34th Hawaii International Conference on System Sciences, p. 1-10.
M. Thomson et al., "Impact of Widespread Photovoltaics Generation on Distribution Systems," Mar. 2007, IET Renew. Power Gener., vol. 1, No. 1 p. 33-40.
Varun et al., "LCA of Renewable Energy for Electricity Generation Systems—A Review," 2009, Renewable and Sustainable Energy Reviews 13, p. 1067-1073.
Andreas Schroeder, "Modeling Storage and Demand Management in Power Distribution Grids," 2011, Applied Energy 88, p. 4700-4712.
Daniel S. Shugar, "Photovoltaics in the Utility Distribution System: The Evaluation of System and Distributed Benefits," 1990, Pacific Gas and Electric Company Department of Research and Development, p. 836-843.
Nguyen et al., "Estimating Potential Photovoltaic Yield With r.sun and the Open Source Geographical Resources Analysis Support System," Mar. 17, 2010, pp. 831-843.
Pless et al., "Procedure For Measuring And Reporting The Performance of Photovoltaic Systems In Buildings," 62 pages, Oct. 2005.
Emery et al., "Solar Cell Efficiency Measurements," Solar Cells, 17 (1986) 253-274.
Santamouris, "Energy Performance of Residential Buildings," James & James/Earchscan, Sterling, VA 2005.
Al-Homoud, "Computer-Aided Building Energy Analysis Techniques," Building & Environment 36 (2001) pp. 421-433.
Thomas Huld, "Estimating Solar Radiation and Photovoltaic System Performance," The PVGIS Approach, 2011 (printed Dec. 13, 2017).
Anderson et al., "Modelling The Heat Dynamics Of A Building Using Stochastic Differential Equations," Energy and Building, vol. 31, 2000, pp. 13-24.
J. Kleissl & Y. Agarwal, "Cyber-Physical Energy Systems: Focus on Smart Buildings," Design Automation Conference, Anaheim, CA, 2010, pp. 749-754, doi: 10.1145/1837274.1837464. (2010).

\* cited by examiner

10

100

120

130

SYSTEM AND METHOD FOR EMPIRICAL ELECTRICAL-SPACE-HEATING-BASED ESTIMATION OF OVERALL THERMAL PERFORMANCE OF A BUILDING

CROSS-REFERENCE TO RELATED APPLICATIONS

This non-provisional patent application is a continuation of U.S. patent No. 10,670,477, issued Jun. 2, 2020, which is a continuation of U.S. Pat. No. 10,024,733, issued Jul. 17, 2018; which claims priority under 35 U.S.C. § 119(e) to U.S. Provisional Patent application, Ser. No. 61/935,285, filed Feb. 3, 2014, the disclosures of which are incorporated by reference.

FIELD

This application relates in general to energy conservation and planning and, in particular, to a system and method for empirical electrical-space-heating-based estimation of overall thermal performance of a building.

BACKGROUND

Concern has been growing in recent days over energy consumption in the United States and abroad. The cost of energy has steadily risen as power utilities try to cope with continually growing demand, increasing fuel prices, and stricter regulatory mandates. Power utilities must also maintain existing infrastructure, while simultaneously finding ways to add more generation capacity to meet future needs, both of which are expensive. Moreover, burgeoning energy consumption continues to negatively impact the environment and deplete natural resources.

Such concerns underlie recent industry and governmental efforts to strive for a better balance between energy supply and consumption. For example, the Zero Net Energy (ZNE) concept, supported by the U.S. Department of Energy, promotes the ideal of a building with ZNE consumption, in that the total energy used by the building annually balances with the total energy generated on-site. In California, the 2013 Integrated Energy Policy Report (IEPR) builds on earlier ZNE goals for California by mandating that all new residential and all new commercial construction be ZNE compliant, respectively, by 2020 and 2030. The IEPR also goes a bit further to define a building as consuming zero net energy, where the net amount of energy produced by on-site renewable energy resources roughly equals the value of the energy consumed by the building annually.

Balancing energy use is challenging. The average consumer continually consumes energy for many different purposes, all of which effect, either directly or implicitly, energy costs and the environment. At home, energy may be consumed for space heating and cooling, lighting, cooking, powering appliances and electrical devices, heating water, and doing laundry. As well, energy may originate from different supply sources, including energy purchased from a power utility or, less frequently, generated on-site. In addition, where walking, bicycling or other physical modes of travel are impracticable, energy may also be used for personal transportation, whether via private conveyance or by public mass transit.

The net effect of personal energy use adds up. Making any kind of change is a two-fold problem that requires careful deliberation, which first requires knowing, in tangible terms, what energy is consumed for what purpose. Energy used for personal transportation can be readily determined based on regular travel patterns and the average costs of fuel and vehicle maintenance. However, absent a detailed energy audit, the contributions of individual components in the home to overall energy consumption are less certain, and establishing a baseline of personal home energy consumption can be difficult due to the range of unknowns. For instance, the cost of electricity tends to be variable, based on season, time of day, and amount consumed, yet calculating electricity costs requires precisely knowing how much electricity is consumed by what components at what times.

Once energy consumption knowledge has been established, changing personal energy consumption requires determining what energy options or alternatives exist that work most efficaciously and, if applicable, which best move the consumer towards a ZNE consumption paradigm. Choosing between energy options and alternatives requires evaluating how home and vehicle selections affect energy consumption, and knowing how energy supply decisions affect costs and environmental impact. However, conventional ways to help consumers make sound energy option and alternative choices have been inadequate due to the option space that must be explored, and forecasting the expected balance between the costs versus benefits of different option scenarios has been unsatisfactory.

Therefore, a need remains for an approach to empowering consumers, particularly residential customers, with answers on personal energy consumption and understanding what options and alternatives work best for their energy needs.

SUMMARY

The percentage of the total fuel purchased for space heating purposes can be fractionally inferred by evaluating annual fuel purchase data. An average of monthly fuel purchases during non-heating season months is first calculated. The fuel purchases for each month is then compared to the average monthly fuel purchase, where the lesser of the average and that month's fuel purchase are added to a running total of annual space heating fuel purchases.

In addition, the overall thermal performance of a building $UA^{Total}$ can be empirically estimated through a short-duration controlled test. Preferably, the controlled test is performed at night during the winter. A heating source, such as a furnace, is turned off after the indoor temperature has stabilized. After an extended period, such as 12 hours, the heating source is turned back on for a brief period, such as one hour, then turned back off. The indoor temperature is allowed to stabilize. The energy consumed within the building during the test period is assumed to equal internal heat gains. Overall thermal performance is estimated by balancing the heat gained with the heat lost during the test period.

Furthermore, potential energy investment scenarios can be evaluated. Energy performance specifications and prices for both existing and proposed energy-related equipment are selected, from which an initial capital cost is determined. The equipment selections are combined with current fuel consumption data, thermal characteristics of the building, and solar resource and other weather data to create an estimate of the fuel consumption of the proposed equipment. An electricity bill is calculated for the proposed equipment, from which an annual cost is determined. The payback of the proposed energy investment is found by comparing the initial and annual costs.

Finally, new energy investments specifically affecting building envelope, heating source, or heating delivery can be evaluated. Data that can include the percentage of a fuel bill for fuel used for heating purposes, an existing fuel bill, existing overall thermal properties $UA^{Total}$ of the building, existing furnace efficiency, new furnace efficiency, existing delivery system efficiency, new delivery system efficiency, areas of building surfaces to be replaced or upgraded, existing U-values of thermal properties of building surfaces to be replaced or upgraded, new U-values of thermal properties of building surfaces to be replaced or upgraded, and number of air changes before and after energy investment are obtained. The impact of energy investments that affect heat transfer through the building envelope due to conduction, heat losses due to infiltration, or both, are quantified by a comparative analysis of relative costs and effects on the building's thermal characteristics, both before and after the proposed changes.

In one embodiment, a system and method for empirical electrical-space-heating-based estimation of overall thermal performance of a building the aid of a digital computer are provided. A non-transitory computer readable storage medium including program code is provided. A thermometer located inside a building is provided. A thermometer located outside of the building is provided. At least one portable electric space heater located inside the building is used, including: stopping operations of the portable electric space heater at the beginning of an unheated period; resuming operating the portable electric space heater at the end of the unheated period and continuing operating the portable electric space heater for a duration of a heated period; stopping the operations of the portable electric space heater at the end of the heated period. A computer processor interfaced to the storage medium, wherein the computer processor is configured to execute the program code is provided. Recorded with the computer processor into the storage medium is a baseline indoor temperature taken by the indoor thermometer and a baseline outdoor temperature taken by the outdoor thermometer prior to the stop of the operation of the at least one portable electric space heater at the beginning of the unheated period. Recorded with the computer processor into the storage medium is a starting indoor temperature taken by the indoor thermometer at the end of the unheated period prior to the resumption of the operation of the at least one portable electric space heater. Recording with the computer processor into the storage medium is a final indoor temperature taken by the indoor thermometer after a stabilizing period following the heated period. Energy consumed in the building from the beginning of the unheated period to the ending of the stabilizing period is measured with the computer processor as equaling heat gained inside the building from internal sources of heat. An expected final indoor temperature at the end of the stabilizing period is estimated with the computer processor based on the at least one portable electric space heater not having been run for the heated period. The heat gained inside the building over the heated period through operation of the portable electric space heater is determined with the computer processor using the electricity requirements of the at least one portable electric space heater, the baseline indoor temperature, the final indoor temperature, the expected final indoor temperature, and the duration the heated period. Overall thermal performance of the building using the heat gained through using the at least one portable electric space heater is estimated with the computer processor, the measured energy, the indoor temperatures, the baseline outdoor temperature, and the estimated final indoor temperature.

Still other embodiments will become readily apparent to those skilled in the art from the following detailed description, wherein are described embodiments by way of illustrating the best mode contemplated. As will be realized, other and different embodiments are possible and the embodiments' several details are capable of modifications in various obvious respects, all without departing from their spirit and the scope. Accordingly, the drawings and detailed description are to be regarded as illustrative in nature and not as restrictive.

DETAILED DESCRIPTION

Private individuals enjoy an immediacy to decision-making on matters of energy consumption and supply. As a result, individuals are ideally positioned to effect the kinds of changes necessary to decrease their personal energy consumption and to choose appropriate sources of energy supply, among other actions. However, merely having an ability or motivation to better balance or reduce energy consumption, including adopting a ZNE goal, are not enough, as the possible ways that personal energy consumption can be decreased are countless, and navigating through the option space can be time-consuming and frustrating. Individual consumers need, but often lack, the information necessary to guide the energy consumption and supply decisions that are required to accomplish their goals.

Figure 1:
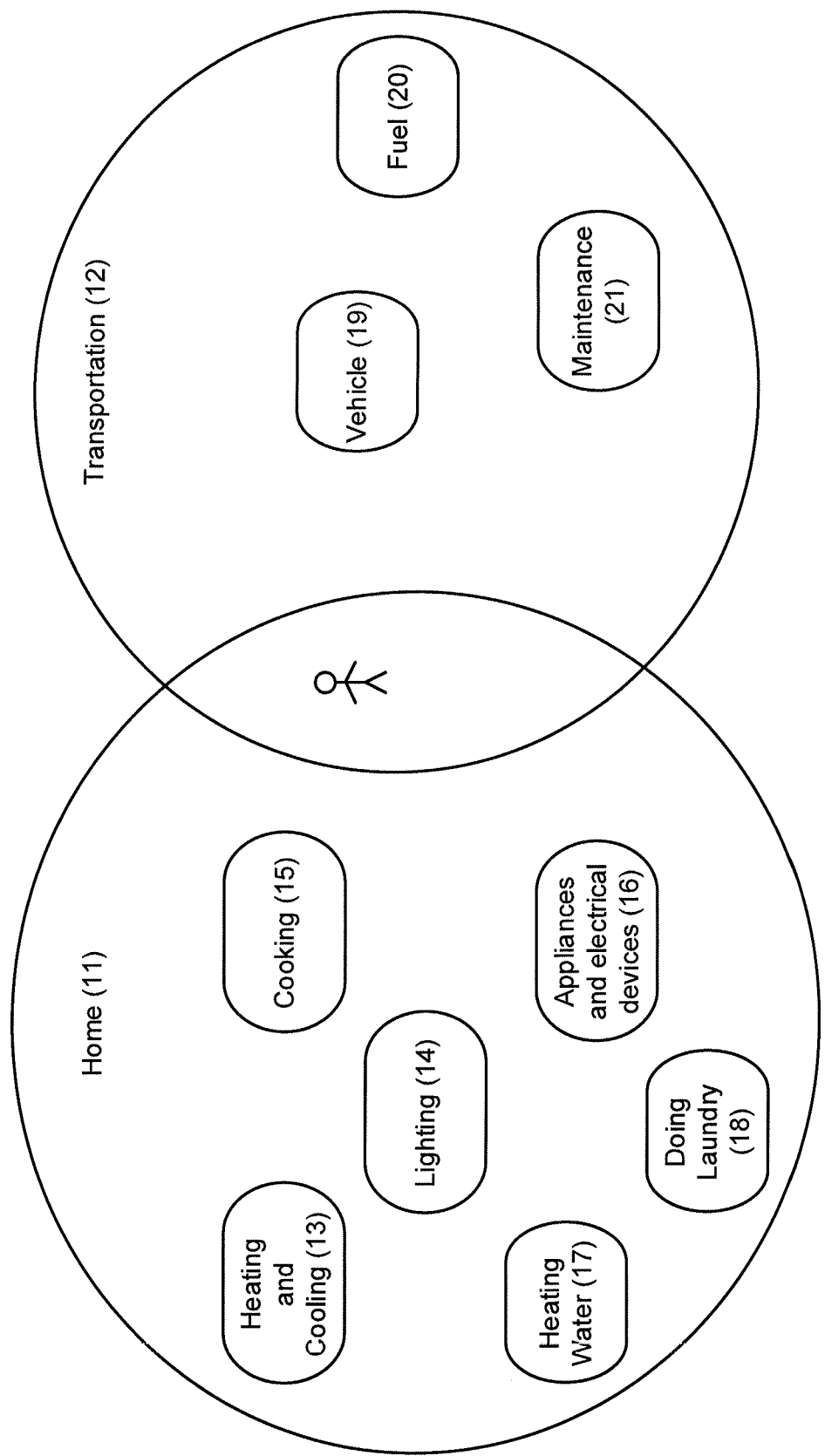
FIG. 1 is a Venn diagram showing, by way of example, a typical consumer's energy-related costs.

The problem of providing consumers with the kinds of information needed to wisely make energy-related decisions can be approached by first developing a cost model, which depicts the energy consumption landscape of the average consumer. Brief Description OF THE DRAWINGS FIG. 1 is a Venn diagram showing, by way of example, a typical consumer's energy-related costs 10. The costs 10 include both fuel costs and operational costs, which provide the basis of the cost model. For purposes of illustration, the cost model assumes that the hypothetical consumer has a private residence, as opposed to an apartment or condominium, and uses a personal vehicle as a primary mode of transportation, rather than public mass transit or a physical mode of travel. The cost model can be adapted mutatis mutandis to other modeling scenarios for apartment dwellers or urban city commuters, for instance, who may have other energy consumption and supply types of expenses.

The cost model builds on the choices made by consumers that affect their energy consumption. For example, residential consumers must choose between various energy options or alternatives concerning weather stripping or caulking to seal a house; increased ceiling, floor, and wall insulation; high-efficiency windows; window treatments; programmable thermostats; cool roofs, that is, roofs that have a high solar reflectance; radiant barriers; roof venting; electric and natural gas furnaces for space heating; air source and geothermal heat pumps for space heating and cooling; compressive and evaporative air conditioners; natural gas and electric, tank-based, and tank-less water heaters; air source heat pump water heaters; fluorescent and LED lights; high efficiency appliances, including clothes washers, clothes dryers, refrigerators, dishwashers, and microwave ovens; electric (conductive and inductive) and natural gas stoves; electric and natural gas ovens; and electronic equipment that consume electricity, such as Wi-Fi routers, televisions, stereos, and so on. Consumers who rely on non-physical modes of travel must choose between standard gasoline- or diesel-fueled vehicles; hybrid gasoline- or diesel-fueled vehicles; natural gas vehicles; plug-in hybrid electric vehicles; and pure electric vehicles. The situation is further complicated in that consumers have choices in energy supply, in addition to their choice in their energy purchases. These choices include purchasing energy, that is, electricity and natural gas, from their local utility; purchasing gasoline, diesel or other automobile fuel from a gasoline station; generating hot water using solar hot water heating; and generating electricity, either for home or transportation purposes, using photovoltaic power generation systems or, less commonly, small wind, small hydroelectric, or other distributed power generation technologies.

In the cost model, the energy-related costs 10 can be divided into categories for home energy costs 11 and personal transportation costs 12. In the home, energy may be consumed for space heating and cooling 13, lighting 14, cooking 15, powering appliances and electrical devices 16, heating water 17, and doing laundry 18, although fewer or more home energy costs may also be possible, such as where a consumer lacks in-home laundry facilities. Personal transportation costs may include the actual cost of the vehicle 19, as well as fuel costs 20 and maintenance expenses 21, although fewer or more transportation costs may also be possible, such as where a company car is provided to the consumer free of charge.

For purposes of the cost model, fuel costs include electricity (E); fuel for heating (F), which could be natural gas, propane, or fuel oil; and fuel for transportation (G), which could be gasoline, diesel, propane, LPG, or other automobile fuel. In addition, maintenance costs will be included in the cost model. A consumer's total energy-related costs ($C^{Total}$) equals the sum of the electricity cost ($C^E$), fuel for heating cost ($C^F$), gasoline (or other automobile fuel) cost ($C^G$), and maintenance cost ($C^M$), which can be expressed as:

$$C^{Total} = C^E + C^F + C^G + C^M \quad (1)$$

In Equation (1), each cost component can be represented as the product of average price and annual quantity consumed, assuming that the price is zero when the quantity consumed is zero. As a result, the total energy-related costs $C^{Total}$ can be expressed as:

$$C^{Total} = P^E Q^E + P^F Q^F + P^G Q^G + P^M Q^M \quad (2)$$

Price and quantity in Equation (2) need to be consistent with each other, but price and quantity do not need to be the same across all cost components. Fuel units depend upon the type of fuel. Electricity price ($P^E$) is expressed in dollars per kilowatt hour (\$/kWh) and electricity quantity ($Q^E$) is expressed in kilowatt hours (kWh). For natural gas, fuel for heating price ($P^F$) is expressed in dollars per thermal unit (\$/therm) and fuel quantity ($Q^F$) is expressed in thermal units (therms). Gasoline (or other automobile fuel) price ($P^G$) is expressed in dollars per gallon (\$/gallon) and gasoline quantity ($Q^G$) is expressed in gallons. If only automobile maintenance costs are included and not the vehicle cost, maintenance price ($P^M$) can be in dollars per mile driven (\$/mile) and maintenance quantity ($Q^M$) can be expressed in miles.

Pricing of fuel for heating ($P^F$) may be a function of the amount of fuel consumed or could be a non-linear value, that is, a value determined independent of amount used, or a combination of amount and separate charges. In the cost model, for clarity, the fuel for heating cost ($C^F$) assumes that the quantity of fuel actually used for space heating is separable from other loads in a home that consume the same type of fuel, as further explained infra.

For fuels for heating sold by bulk quantity, such as propane or fuel oil, fuel pricing is typically on a per-unit quantity basis. For other fuels for heating, such as natural gas, a number of utilities have tiered natural pricing that depend upon the quantity consumed. In particular, electricity pricing can be complicated and may depend upon a variety of factors, including the amount of electricity purchased over a set time period, such as monthly, for instance, tiered electricity prices; the timing of the electricity purchases, for instance, time-of-use electricity prices; fixed system charges; and so forth. As a result, accurately calculating average electricity pricing often requires detailed time series electricity consumption data combined with electricity rate structures. Conventional programs and online services are available to perform electricity pricing calculations. A slightly different formulation of electricity pricing may be used where the quantity of electricity purchased nets out to zero consumption, but the total cost does not, such as can occur due to a flat service surcharge.

In the cost model, the quantity of electricity ($Q^E$), fuel for heating ($Q^F$), and gasoline (or other automobile fuel) ($Q^G$) purchased is assumed to equal the quantity consumed for meeting the consumer's energy consumption requirements. Gasoline (or other automobile fuel) fuel quantity ($Q^G$) can be fairly estimated based on miles driven annually over observed or stated vehicle fuel efficiency, such as available from www.fueleconomy.gov. Electricity quantity ($Q^E$) can generally be obtained from power utility bills.

The quantity of fuel for heating ($Q^F$) grossly represents the amount of fuel that needs to be purchased to provide the desired amount of heat in the consumer's home. The amount of fuel used for heating may actually be smaller than the total amount of fuel delivered to the home; depending upon the types of components installed in a home, the fuel used for heating may also be the same fuel used for other purposes, which may include fuel used, for example, for heating water, cooking, or drying clothes. Notwithstanding, utilities that provide fuel to their customers for heating and other purposes, in particular, natural gas, via piped-in public utility service generally meter net fuel purchases at the point of delivery. Individual loads are not metered. Thus, the total quantity of fuel ($Q^F$) consumed may need to be divided into the amount of fuel used strictly for space heating ($Q^{F\text{-}Heating}$) and the amount of fuel used for other non-space heating purposes ($Q^{F\text{-}Non\text{-}Heating}$). For instance, in many residential situations, much of the non-space heating fuel will be used for water heating. The load-corrected quantity of fuel ($Q^F$) can be expressed as:

$$Q_F = Q^{F\text{-}Heating} + Q^{F\text{-}Non\text{-}Heating} \tag{3}$$

Modeling the quantity of fuel consumed for space heating ($Q^F$) requires consideration of the type of space heating employed in a home. A separate quantity of fuel for space heating is only required if the type of heating system used does not use electricity for active heat generation. Active heating sources, such as central heating systems, include a heating element that heats the air or water, for instance, a furnace or boiler, and a heating delivery or distribution component, such as ductwork through which the heated air is forced by an electric fan or pipes through which the heated water is circulated via an electric pump. Thus, where the heating element requires, for instance, natural gas, propane, or fuel oil to generate heat, the quantity of fuel for space heating consumed will be equal to the consumer's energy consumption for space heating requirements. In contrast, where the heating element relies on electricity for active heat generation, such as passive radiant heating or an electric-powered air source heat pump, the quantity of fuel for space heating will be zero, although the total quantity of electricity ($Q^E$) consumed will be significantly higher due to the electricity used for heat generation. The fuel for space heating quantity ($Q^F$) can be normalized to the quantity of electricity ($Q^E$) for purposes of comparison. Estimating the amount of fuel consumed for space heating requirements will now be discussed.

The overall rate of heat transfer of a building equals the rate of the heat transfer or conduction through each unique building surface plus the rate of heat transfer through infiltration, that is, air leakage into a building. Conduction rate and infiltration rate are based on the thermal characteristics of the material in each surface of the building and upon the indoor and outdoor temperatures and airtightness of the building.

Heat transfer can be individually calculated for each building surface, then summed to yield overall heat transfer. Alternatively, a building's overall thermal performance ($UA^{Total}$) can first be calculated, expressed in units of Btu per °F.-hour. Overall thermal performance can then be combined with the difference between the indoor and outdoor temperature. When the latter approach is used, the heat loss over a one-hour period $Q^{Heat\ Loss}$ equals $UA^{Total}$ times the difference between the average indoor and outdoor temperature times one hour, which can be expressed as:

$$Q^{Heat\ Loss} = (UA^{Total})(T_{Indoor} - T_{Outdoor})(1\ \text{hour}) \tag{4}$$

Equation (4) can be rearranged to yield $UA^{Total}$:

$$UA^{Total} = \frac{Q^{Heat\ Loss}}{(T_{Indoor} - T_{Outdoor})(1\ \text{hour})} \tag{5}$$

Total heat loss $Q^{Heat\ Loss}$ can be analytically estimated based on furnace sizing for the building, such as described in H. Rutkowski, *Manual J Residential Load Calculation*, ($8^{th}$ ed. 2011) ("Manual J"), and also as provided via the Air Conditioning Contractors of America's Web-fillable Form RPER 1.01, available at www.acca.org. Per the Manual J approach, winter and summer design conditions are specified, including indoor and outdoor temperatures. In addition, surface measurements and materials, estimated infiltration, heating and cooling equipment capacities, and duct distribution system design are specified.

These values are used in the Manual J approach to estimate total heat loss per hour, from which a recommended heating output capacity is determined. For example, a heating system having a 64,000 Btu/hour heating output capacity would be appropriate in a building with an estimated total heat loss of 59,326 Btu/hour. Assuming an outdoor temperature of −6° F. and an indoor temperature of 70° F., Equation (5) can be used to estimate $UA^{Total}$ based on the estimated total heat loss of 59,326 Btu/hour, such that:

$$UA^{Total} = \frac{59{,}326\ \text{Btu}}{[70°\ \text{F.} - *(-6°\ \text{F.})](1\ \text{hour})} = \frac{781\ \text{Btu}}{°\ \text{F.-hour}} \tag{6}$$

The result is that this building's overall thermal performance is 781 Btu/hr-° F. Other ways of estimating total heat loss $Q^{Heat\ Loss}$ are possible.

Equation (4) provides an estimate of the heat loss over a one-hour period $Q^{Heat\ Loss}$ for a building. Equation (4) can also be used to derive the amount of heat that needs to be delivered to a building $Q^{Heat\ Delivered}$ by multiplying the building's overall thermal performance $UA^{Total}$, times 24 hours per day, times the number of Heating Degree Days, such as described in J. Randolf et al., *Energy for Sustainability: Technology, Planning, Policy*, p. 248 (2008), which can be expressed as:

$$Q^{Heat\ Delivered} = (UA^{Total})(24)(HDD_{Location}^{Set\ Point\ Temp}) \tag{7}$$

The number of Heating Degree Days, expressed as $HDD_{Location}^{Set\ Point\ Temp}$ in °F.-day per year, is determined by the desired indoor temperature and geographic location and can be provided by lookup tables.

In turn, the annual amount of heat delivered by a furnace to a building for end-use $Q^{Heat\ Delivered\text{-}Furnace}$, expressed in Btu per hour, equals the product of furnace fuel requirements $R^{Furnace}$, also expressed in Btu per hour, percentage of furnace efficiency $\eta^{Furnace}$, percentage of delivery system efficiency $\eta^{Delivery}$, and hours of operation Running-Time, such that:

$$Q^{Heat\ Delivered\text{-}Furnace} = (R^{Furnace})(\eta^{Furnace}\eta^{Delivery})$$
$$(\text{Running-Time}) \tag{8}$$

The annual amount of heat delivered $Q^{Heat\ Delivered\text{-}Furnace}$ can be discounted by the amount of energy passively obtained on-site. For instance, if the solar savings fraction (SSF) represents the fraction of energy by a building due to solar gains, the heat that needs to be delivered by the furnace can be expressed by:

$$Q^{Heat\ Delivered\text{-}Furnace} = Q^{Heat\ Delivered}(1-SFF) \quad (9)$$

For the time being, ignore any gains in indoor temperature due to internal sources of heat.

The amount of fuel used strictly for space heating $Q^{F\text{-}Heating}$ can be found by substituting Equation (7) into Equation (9), setting the result equal to Equation (8), and solving for $Q^{F\text{-}Heating}$. The amount of fuel that needs to be purchased for space heating uses $Q^{F\text{-}Heating}$ equals the product of furnace fuel requirements $R^{Furnace}$ and hours of operation hours Running-Time. Thus, solving for $Q^{F\text{-}Heating}$:

$$Q^{F\text{-}Heating} = \frac{(UA^{Total})(24)(HDD_{Location}^{Set\ Point\ Temp})(1-SSF)}{\eta^{Furnace}\eta^{Delivery}} \quad (10)$$

Calculating the solar savings fraction SSF typically requires extensive computer modeling. However, for an existing building, the SSF can be determined by setting Equation (10) equal to the amount of fuel required for space heating and solving for the solar savings fraction.

In general, utilities that provide fuel to their customers via piped-in public utility services meter fuel purchases at the point of delivery and not by individual component load. In situations where the fuel is used for purposes other than solely space heating, the total fuel purchased for space heating $Q^{F\text{-}Heating}$ may only represent a fraction of the total fuel purchased $Q^F$. $Q^{F\text{-}Heating}$ can be expressed as:

$$Q^{F\text{-}Heating} = (H)(Q^F) \quad (11)$$

where H fractionally represents the percentage of the total fuel purchased for space heating purposes.

Figure 2:
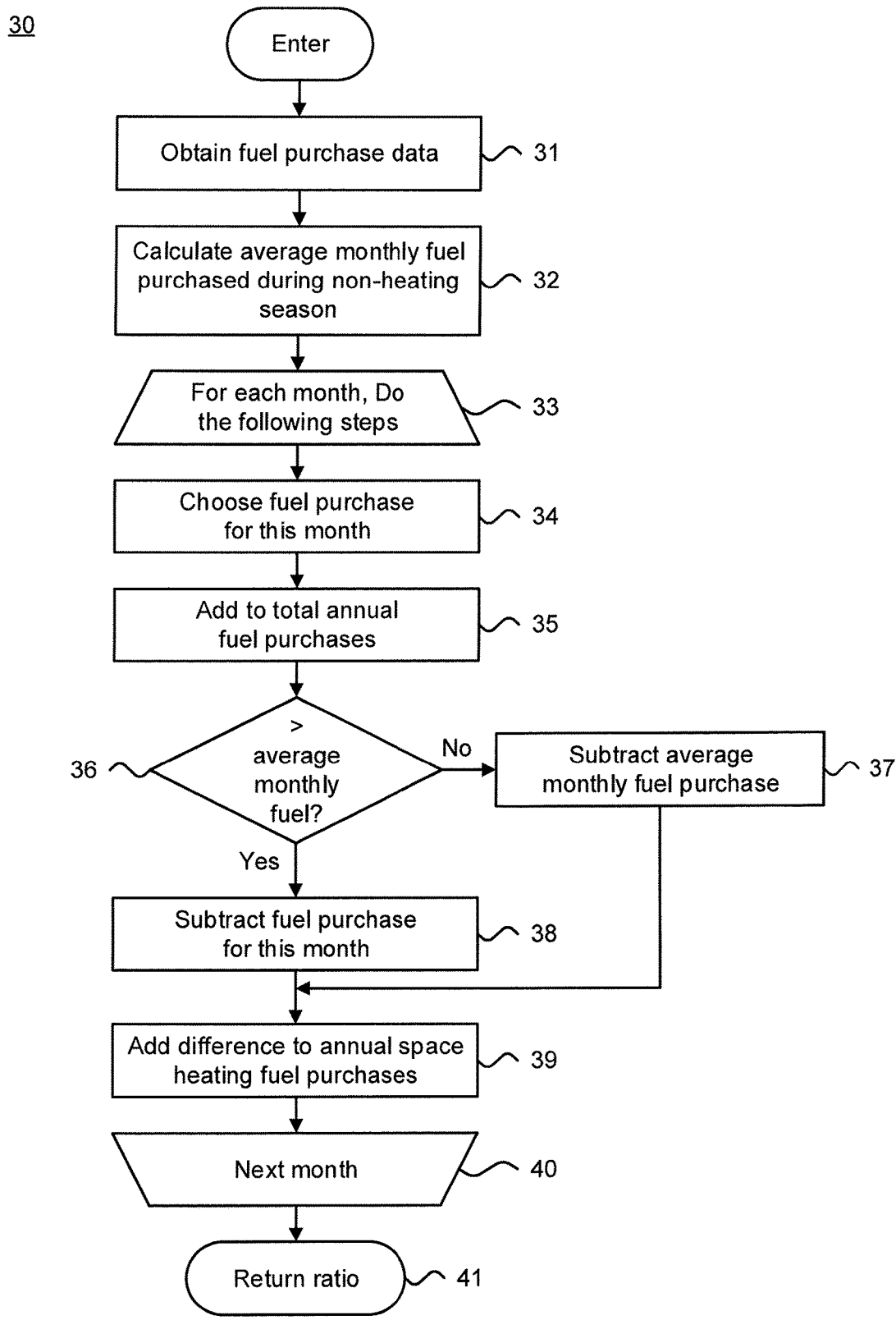
FIG. 2 is a flow diagram showing a function for fractionally inferring the percentage of the total fuel purchased for space heating purposes, in accordance with one embodiment.

The fraction H can be empirically inferred from fuel purchase data. Fuel purchased in the months occurring outside of the heating season are assumed to represent the fuel purchased for non-space heating needs and can be considered to represent a constant baseline fuel expense. FIG. 2 is a flow diagram showing a function 30 for fractionally inferring the percentage of the total fuel purchased for space heating purposes, in accordance with one embodiment. The function 30 can be implemented in software and execution of the software can be performed on a computer system, such as further described infra with reference to FIG. 14, as a series of process or method modules or steps.

Initially, fuel purchase data is obtained (step 31), such as can be provided by the fuel utility. Preferably, the data reflects fuel purchases made on at least a monthly basis from the utility. An average of the fuel purchased monthly during non-heating season months is calculated (step 32). In some regions, the heating season will only include traditional winter months, beginning around mid-December and ending around mid-March; however, in most other regions, space heating may be required increasingly in the months preceding winter and decreasingly in the months following winter, which will result in an extended heating season.

Each month (or time increment represented by each fuel purchase) is then iteratively processed (steps 33-40), as follows. For each month (step 33), the fuel purchase for that month is chosen (step 34) and added to a running total of annual fuel purchases (step 35). If the monthly fuel purchase is greater than the average of the fuel purchased monthly during non-heating season months (step 36), the average of the fuel purchased monthly is subtracted from that monthly fuel purchase (step 37) and the remainder represents the fuel purchased for space heating in that month. Otherwise, the monthly fuel purchase is subtracted from itself (step 38), effectively indicating that the fuel purchased for space heating in that month is zero. The difference of the subtraction, that is, the fuel purchased for space heating in that month, is added to a running total of annual space heating fuel purchases (step 39), and the process repeats for each subsequent month (step 40). Finally, the ratio of the running total of annual space heating fuel purchases to the running total of annual fuel purchases is returned (step 41) as the fraction H.

Figure 3:
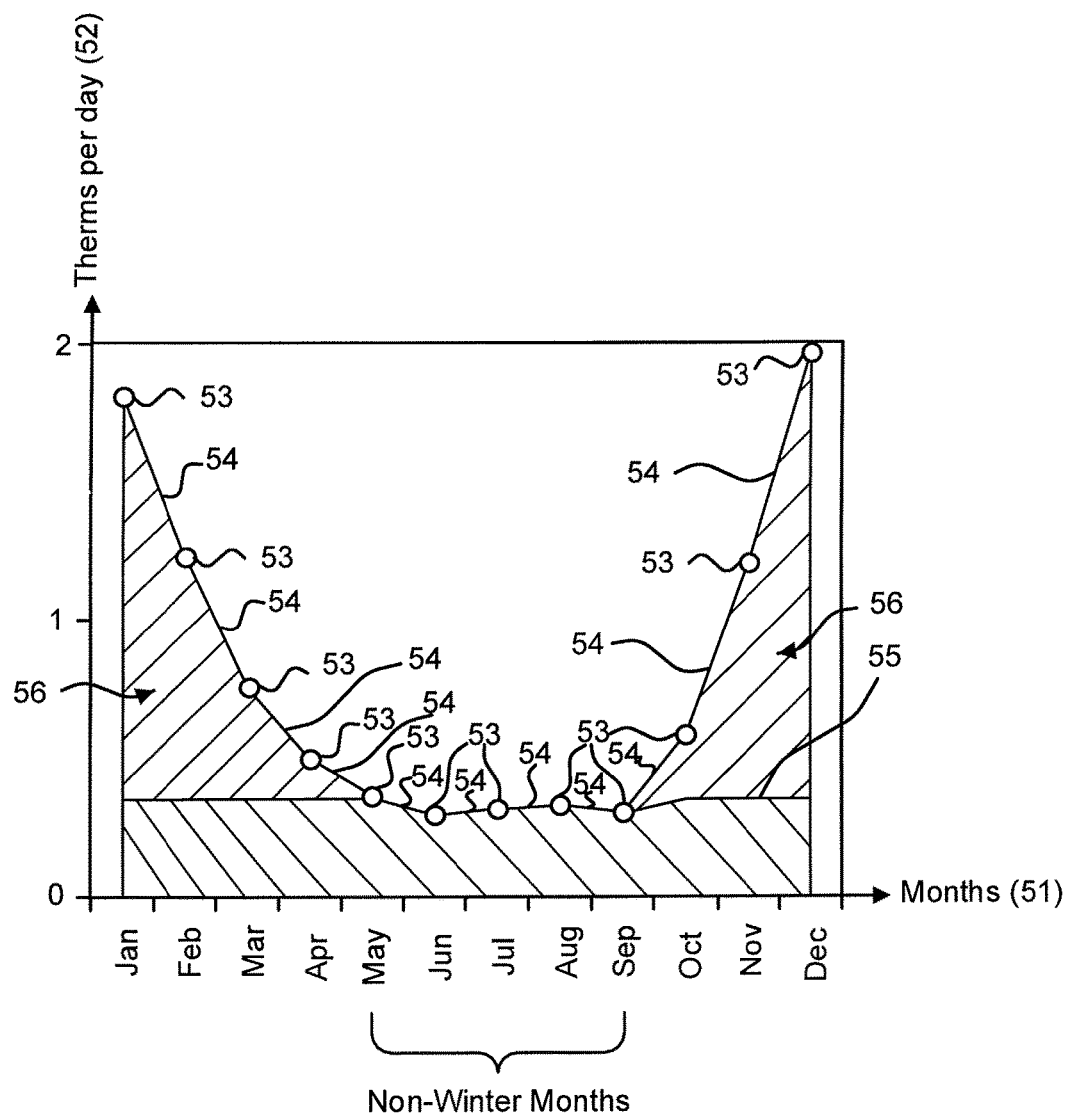
FIG. 3 is a graph depicting, by way of example, annual fuel purchases, including fuel purchased for space heating purposes.

The relationship between total annual fuel purchases and total annual space heating fuel purchases can be visualized. FIG. 3 is a graph 50 depicting, by way of example, annual fuel purchases, including fuel purchased for space heating purposes. The x-axis 51 represents months. The y-axis 52 represents natural gas consumption, expressed in therms per day. May through September are considered non-winter (non-heating season) months. The natural gas (fuel) purchases 53 for each month are depicted as circles. Total annual fuel purchases 54 can be interpolated by connecting each monthly natural gas purchase 53. The fraction H for the percentage of the total fuel purchased for space heating purposes each month is determined, from which a baseline annual fuel expense 55 can be drawn. The region between the baseline annual fuel expense 55 and the interpolated total annual fuel purchases 54 represents the total annual space heating (fuel) purchases 56.

The relationship between the total annual fuel purchases, baseline fuel expenses, and total space heating purchases can be formalized. First, the average monthly fuel purchased for non-winter months $\overline{Q^{F\text{-}Non\text{-}Winter}}$ over a set number of months is calculated, as follows:

$$\overline{Q^{F\text{-}Non\text{-}Winter}} = \frac{\sum_{i=Non\text{-}Winter\ Start\ Month}^{Non\text{-}Winter\ End\ Month} Fuel\ Puschased_i}{Number\ of\ Months} \quad (12)$$

where i represents the range of non-winter months within the set number of months; and Fuel Purchased$_i$ represents the fuel purchased in the non-winter month i.

Next, the fuel consumed each month for heating, which is the difference between the monthly fuel purchase and the minimum of either the monthly fuel purchase or the average monthly fuel purchased for non-winter months, is added to a summation to yield the total annual fuel consumed for heating $Q^{F\text{-}Heating}$ as follows:

$$Q^{F\text{-}Heating} = \sum_{i=1}^{12}\left(Fuel\ Purchased_i - \min\left(Fuel\ Purchased_i, \overline{Q^{F\text{-}Non\text{-}Winter}}\right)\right) \quad (13)$$

Assuming that the total annual fuel purchases $Q^F$ are non-zero, the ratio of the total annual fuel consumed for heating $Q^{F\text{-}Heating}$ and the total fuel purchases $Q^F$ is taken to yield the fraction H, as follows:

$$H = \frac{Q^{F\text{-}Heating}}{Q^F} \quad (14)$$

Finally, the percent of heat supplied by the solar savings fraction can be determined by setting Equation (10) equal to Equation (11) and solving for SSP, in accordance with:

$$SSF = 1 - \frac{(H)(Q^F)(\eta^{Furnace})(\eta^{Delivery})}{(UA^{Total})(24)(HDD_{Location}^{Set\ Point\ Temp})} \quad (15)$$

A building's overall thermal performance $UA^{Total}$ is key to estimating the amount of fuel consumed for space heating requirements. Equation (5), discussed supra, presents one approach to estimating $UA^{Total}$, provided that the total heat loss $Q^{Heat\ Loss}$ can be estimated. An analytical approach to determining $UA^{Total}$ requires a detailed energy audit, from which $UA^{Total}$ is then calculated using a set of industry-standard engineering equations. With both approaches, the building's actual thermal performance is not directly measured. A third approach through $UA^{Total}$ can be empirically quantified will now be presented.

The total heat transfer of a building at any instant in time ($q^{Total}$) equals the sum of the heat transferred through the building envelope by conduction ($q^{Envelope}$) plus the heat transferred through infiltration ($q^{Infiltration}$), which can be expressed as:

$$q^{Total} = q^{Envelope} + q^{Infiltration} \quad (16)$$

An energy audit does not directly measure the heat transferred through the building envelope by conduction $q^{Envelope}$. Rather, $q^{Envelope}$ is calculated using a series of steps. First, the surface areas of all non-homogeneous exterior-facing surfaces are either physically measured or verified, such as by consulting plans for the building. Non-homogeneous surfaces are those areas that have different insulating materials or thicknesses. The surface areas of all floors, walls, ceilings, and windows are included.

Second, the insulating properties of the materials used, quantified as "R-values," or the capacity of an insulating material to resist heat flow for all surfaces area determined. R-values are generally determined by visual inspection, if the insulation is exposed, such as insulation batts used in an attic. When the insulation cannot be visually inspected, as with wall insulation, R-values are estimated based on surface thickness and the age of the building.

These first two steps are difficult, time-consuming, and carry the risk of mistakes. Accurately measuring all of the exterior-facing surfaces can be tedious, and the manual nature of the visual inspection admits of error. For instance, some wall surfaces may appear to be only interior-facing, yet parts of a wall may actually be both interior- and exterior-facing, as can happen in a split-level home along the wall dividing the "split" sections of the house (also referred to as a knee wall). When viewed from inside, the wall along the split, on both sides, appears to be an interior-facing wall, yet the upper section of that wall is often partially exposed to the exterior along the outer wall surface extending beyond the ceiling height of the lower section of the split. In addition, issues, such as improperly installed insulation and insulation falling away from a wall, can be missed by a visual inspection.

Third, the R-values are inverted to yield U-values, which are then multiplied by their corresponding surface areas. The results are summed across all N surfaces of the building. Total heat transfer through the building envelope by conduction $q^{Envelope}$ equals the product of this summation times the difference between the indoor and outdoor temperatures, expressed as:

$$q^{Envelope} = \left(\sum_{i=1}^{N} U^i A^i\right)(T^{Indoor} - T^{Outdoor}) \quad (17)$$

where $U^i$ represents the U-value of surface i; $A^i$ represents the surface area of surface I; and $T^{Indoor}$ and $T^{Outdoor}$ are respectively the indoor and outdoor temperatures relative to the building.

Heat transfer also occurs due to infiltration. "A major load for your furnace is heating up cold air leaking into your house, while warm indoor air leaks out. These infiltration losses are driven in part by the difference in the indoor-to-outdoor temperature (stack-driven infiltration) and in part by the pressure differences caused by the wind blowing against the side of the house (wind-driven insolation)." J. Randolf et al. at p. 238, cited supra. Formally, the rate of heat transfer due to infiltration $q^{Infiltration}$ can be expressed as:

$$q^{Infiltration} = \rho c n V (T^{Indoor} - T^{Outdoor}) \quad (18)$$

where ρ represents the density of air, expressed in pounds per cubic foot; c represents the specific heat of air, expressed in Btu per pound ° F.; n is the number of air changes per hour, expressed in number per hour; and V represents the volume of air per air change, expressed in cubic feet per air change.

In Equation (18), ρ and c are constants and are the same for all buildings; ρ equals 0.075 lbs/ft³ and c equals 0.24 Btu/lb-° F. n and V are building-specific values. V can be measured directly or can be approximated by multiplying building square footage times the average room height. Measuring n, the number of air changes per hour, requires significant effort and can be directly measured using a blower door test.

Total heat transfer $q^{Total}$ can now be determined. To review, $q^{Total}$ equals the sum of the heat transfer through the building envelope by conduction $q^{Envelope}$ plus the heat transfer through infiltration $q^{Infiltration}$. Substitute Equation (17) and Equation (18) into Equation (16) to express the rate of heat loss $q^{Total}$ for both components:

$$q^{Total} = UA^{Total}(T^{Indoor} - T^{Outdoor}) \quad (19)$$

where:

$$UA^{Total} = \left(\sum_{i=1}^{N} U^i A^i\right) + \rho c n V \quad (20)$$

Equation (19) presents the rate of heat transfer $q^{Total}$ at a given instant in time. Instantaneous heat transfer can be converted to total heat transfer over time $Q_{\Delta t}^{Total}$ by adding a time subscript to the temperature variables and integrating over time. $UA^{Total}$ is constant over time. Integrating Equation (19), with $UA^{Total}$ factored out, results in:

$$Q_{\Delta t}^{Total} = UA^{Total} \int_{t_0}^{t_0 + \Delta t} (T_t^{Indoor} - T_t^{Outdoor}) dt \quad (21)$$

Equation (21) can be used in several ways. One common application of the equation is to calculate annual fuel requirements for space heating. Building occupants typically desire to maintain a fixed indoor temperature during the summer and a different fixed indoor temperature during the winter. By the same token, building operators typically want to determine the costs of maintaining these desired indoor temperatures.

For example, take the case of maintaining a fixed indoor temperature during the winter. Let the temperature be represented by $T^{Indoor\text{-}Set\ Point\ Temp}$ and let $\Delta t$ equal one year. Equation (21) can be modified to calculate the annual heat loss $Q_{Annual}^{Heat\ Loss}$ by adding a maximum term, such that:

$$Q_{Annual}^{Heat\ Loss} = UA^{Total} \int_{t_0}^{t_0+\Delta t} \max(T_t^{Indoor\text{-}Set\ Point\ Temp} - T_t^{Outdoor}, 0) dt \quad (22)$$

Solving Equation (22) yields:

$$Q_{Annual}^{Heat\ Loss} = UA_{Total}(24 * HDD^{Indoor\text{-}Set\ Point\ Temp}) \quad (23)$$

where HDD represents the number of degree days when the outdoor temperature exceeds the desired indoor temperature. A typical indoor temperature used to calculate HDD is 65° F.

Equation (23) is a widely-used equation to calculate annual heat loss. $UA^{Total}$ is the core, building-specific parameter required to perform the calculation. $UA^{Total}$ represents the building's overall thermal performance, including heat loss through both the building envelope through conduction and heat loss through infiltration. Conventional practice requires an energy audit to determine $UA^{Total}$, which requires recording physical dimension, visually inspecting or inferring R-values, and performing a blower door test. A formal energy audit can require many hours and can be quite expensive to perform. However, $UA^{Total}$ can be empirically derived.

Figure 4:
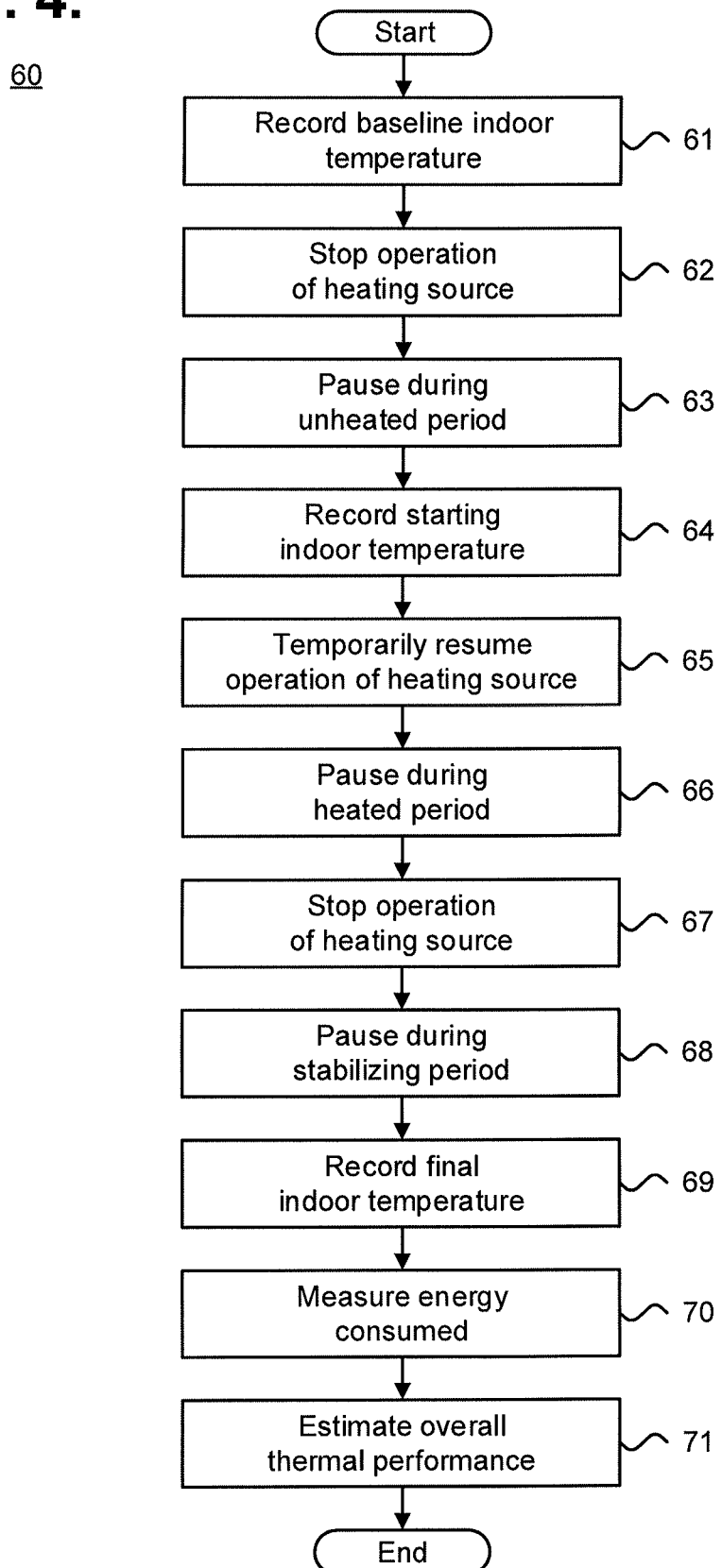
FIG. 4 is a flow diagram showing method for empirically estimating overall thermal performance of a building through a short-duration controlled test, in accordance with one embodiment.

In slightly modified form, Equation (21) can be used to calculate Heating (or Cooling) Degree Days for estimating fuel costs for a one-year period by assuming that the indoor temperature is constant. The equation can also be used to calculate short-term heat loss, as part of an input to an empirical approach to deriving a building's overall thermal performance $UA^{Total}$. FIG. 4 is a flow diagram showing method for empirically estimating overall thermal performance of a building 60 through a short-duration controlled test, in accordance with one embodiment. The method 60 requires the use of a controllable heating (or cooling) source, and the measurement and analysis aspects of the method 60 can be implemented in software. Execution of the software can be performed with the assistance a computer system, such as further described infra with reference to FIG. 14, as a series of process or method modules or steps.

Briefly, the empirical approach is to perform a controlled test over a short duration, for instance, 12 hours. During the controlled test, heat loss from a building occurs and a controllable heat source, such as a furnace, is subsequently used to compensate for the heat loss. Preferably, the controlled test is performed during the winter months. The same controlled test approach can be used during the summer months, where heat gain occurs and a controllable cooling source, such as an air conditioner, is subsequently used to compensate for the heat gain.

Figure 5:
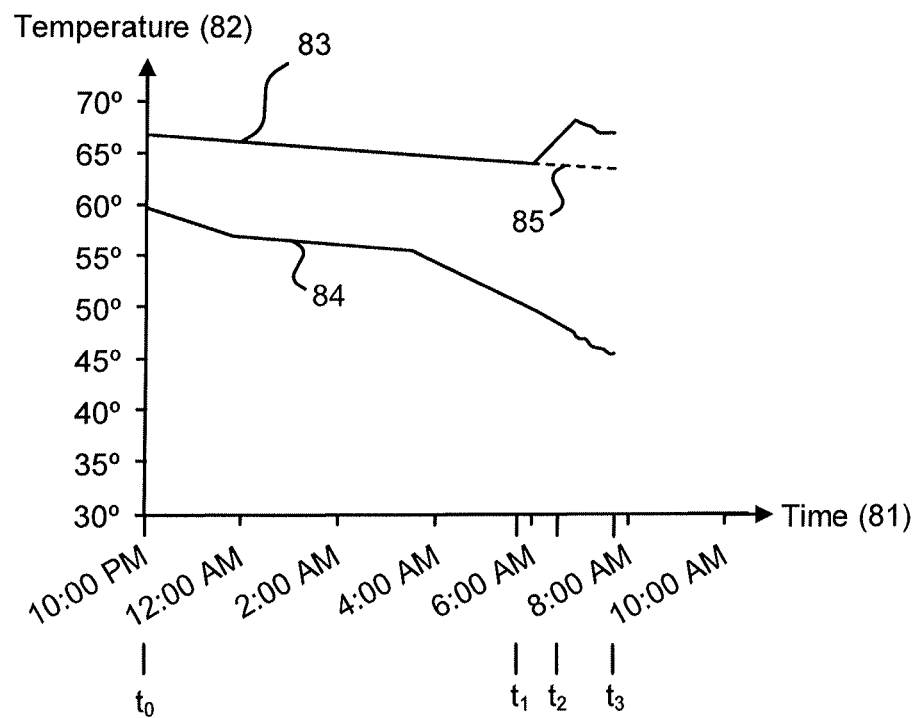
FIG. 5 is a graph depicting, by way of example, the controlled, short-duration test of FIG. 4.

As a preliminary step, an appropriate testing period is chosen, during which heat gain is controllable, such as during the night, when solar gain will not be experienced. FIG. 5 is a graph depicting, by way of example, the controlled, short-duration test of FIG. 4. The x-axis 81 represents time of day. The y-axis 82 represents temperature in ° F. The testing period is divided into an unheated period that occurs from time $t_0$ to time $t_1$, a heated period that occurs from time $t_1$ to time $t_2$, and a stabilizing period that occurs from time $t_2$ to time $t_3$. At a minimum, indoor temperature 83 is measured at times $t_0$, $t_1$, and $t_3$, although additional indoor temperature measurements will increase the accuracy of the controlled test. Outdoor temperature 84 may optionally be measured at times $t_0$ and $t_3$ and additional outdoor temperature measurements will also increase the controlled test's accuracy. Additionally, an expected final indoor temperature 85 is estimated based on a projection of what the indoor temperature would have been at time $t_3$, had the heating source not been turned back on at time $t_1$.

The starting time $t_0$ of the unheated period should start when the indoor temperature has stabilized due to the effects of thermal mass. The unheated period is of a duration sufficient to allow for measurable heat loss, such as a period of around 12 hours, although other periods of time are possible. The heating source is run for a short duration during the heated period, such as for an hour or so, preferably early in the morning before the sun rises. The stabilizing period provides a time lag for a short duration, such as an hour or so, to allow the indoor temperature to stabilize due to the effects of thermal mass. Other factors can be included in the controlled test, such as heat gain from occupants or other heat sources inside the building.

Referring back to FIG. 4, a baseline indoor temperature $T_0$ is recorded at the outset of an unheated period at time $t_0$ (step 61), at which time operation of the heating source is also stopped (step 62). The method pauses during the unheated period from time $t_0$ to time $t_1$ (step 63). A starting indoor temperature $T_1$ is recorded at the outset of a heated period at time $t_1$ (step 64), at which time operation of the heating source is also temporarily resumed (step 65). The method pauses during the heated period from time $t_1$ to time $t_2$ (step 66). Operation of the heating source is again stopped at the end of the heated period at time $t_2$ (step 67). The method pauses during a stabilizing period from time $t_2$ to time $t_3$ (step 68). A final indoor temperature $T_3$ is recorded at the end of a stabilizing period at time $t_3$ (step 69).

Next, the amount of energy consumed over testing period from time $t_0$ to time $t_3$ is measured (step 70). The energy is assumed to equal the total amount of heat gained inside the building from internal sources of heat ($Q^{Internal}$); inclusion of independent sources of heat gain, such as from occupants, will increase accuracy. Finally, the overall thermal performance of the building $UA^{Total}$ and distribution efficiency are estimated (step 71), as follows.

First, the heat loss over the unheated period from time $t_0$ to time $t_1$ is calculated, that is, by setting $\Delta t$ to around 12 hours. Solving Equation (21) yields:

$$Q_{\Delta t}^{Total} = UA^{Total}(\overline{T_{\Delta t}^{Indoor}} - \overline{T_{\Delta t}^{Outdoor}})\Delta t \quad (24)$$

where $\overline{T_{\Delta t}^{Indoor}}$ the average indoor temperature and $\overline{T_{\Delta t}^{Outdoor}}$ is the average outdoor temperature.

Next, the heat gain by operating the heating source over the heated period from time $t_1$ to time $t_2$ is calculated using Equation (8). The amount of energy required to return the building to the baseline indoor temperature $T_0$ can be approximated by dividing the delivered heat by the percent of heat loss that was restored using the controlled heat source. The amount of heat restored is assumed to be proportional to three temperatures, the baseline indoor temperature $T_0$, the final indoor temperature $T_3$, and an expected final indoor temperature $T_3^{No\ Heat}$, which is an estimated temperature based on a projection of what the indoor temperature would have been at time $t_3$, had the heating source not been turned back on at time $t_1$. Assuming that $T_0 \neq T_3^{No\ Heat}$, the percentage of energy lost provided by the heat source equals:

$$\text{Percent Restored} = \frac{T_3 - T_3^{No\ Heat}}{T_0 - T_3^{No\ Heat}} \quad (25)$$

The hours of operation of the heating source equal $t_2$ minus $t_1$. Thus, the heat gain required to replace the lost heat equals Equation (8) divided by Equation (25), expressed as:

$$Q^{Heat\ Delivered-Furnace} = (R^{Furnace})(\eta^{Furnace}\eta^{Delivery})(t_2 - t_1)\left(\frac{T_0 - T_3^{No\ Heat}}{T_3 - T_3^{No\ Heat}}\right) \quad (26)$$

In addition, heat was gained inside the building from internal sources of heat. Set Equation (33) plus heat delivered through internal gains $Q^{Internal}$ equal to Equation (24) and solve for overall thermal performance $UA^{Total}$:

$$UA^{Total} = \frac{\left[\frac{(R^{Furnace})(\eta^{Furnace})(\eta^{Delivery})}{(t_2 - t_1)(T_0 - T_3^{No\ Heater})} + Q^{Internal}\right]}{(T_{\Delta t}^{Indoor} - T_{\Delta t}^{Ambient})(t_3 - t_0)} \quad (27)$$

Figure 6:
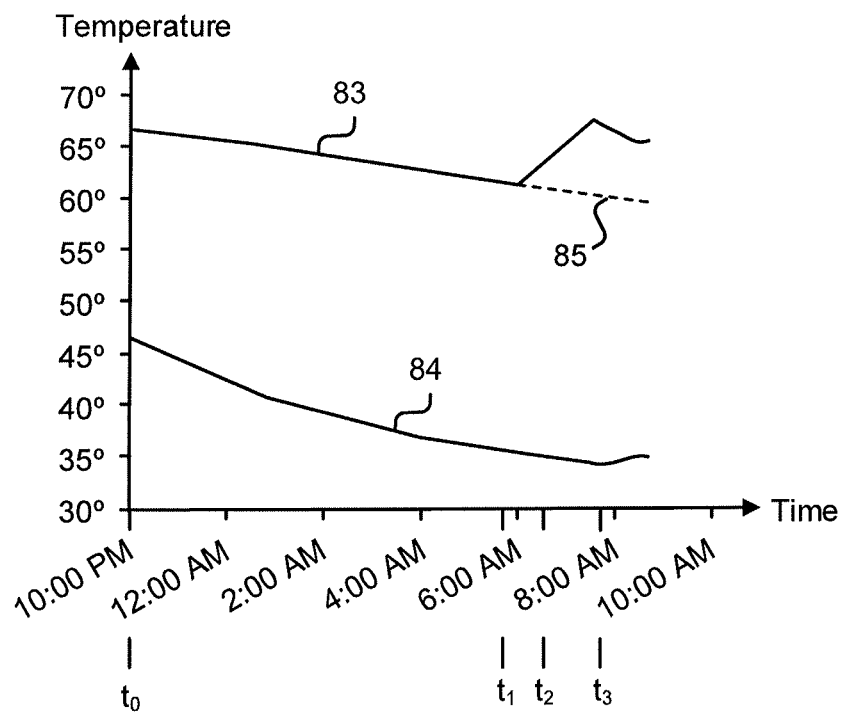
FIG. 6 is a graph depicting, by way of example, the controlled, short-duration test of FIG. 4 for a different day.

The controlled test approach has been empirically validated. The testing procedure was conducted at approximately the same time of day on two separate days with different weather conditions for a house in Napa, Calif. The first test was started on Jan. 12, 2014 and the second test was started on Jan. 13, 2014. There was a difference of about 15° F. in outdoor temperature at the start of the testing on the two days. In addition, the heating source was only operated for the amount of time necessary to return the house to the baseline temperature for the first test, while the heating source was not operated for a sufficiently long time to return the house to the baseline temperature for the second test. The recorded indoor and outdoor temperatures for the test conducted on Jan. 12, 2014 is shown in FIG. 5. Similarly, FIG. 6 is a graph depicting, by way of example, the controlled, short-duration test of FIG. 4 for Jan. 13, 2014. As before, the x-axis represents time of day and the y-axis represents temperature in ° F. Assuming an 80% delivery efficiency $\eta^{Delivery}$, results indicate that the house's overall thermal performance $UA^{Total}$ was 525 for the first test and 470 for the second test. These results are within approximately 10 percent of each other. In addition, an independent Certified Home Energy Rating System (HERS) rater was hired to perform an independent energy audit of the house. The results of the HERS audit compared favorably to the results of the empirical approach described supra with reference to FIG. 4.

The methods described herein can be used to equip consumers with the kinds of information necessary to make intelligent energy decisions. An example of how to apply the results to a particular situation will now be presented.

Example: A residential homeowner has an old heating, ventilation, and air conditioning (HVAC) system that is on the verge of failure. The consumer is evaluating two options:

Option 1: Replace the existing HVAC system with a system that has the same efficiency and make no other building envelope investments in the house, at the cost of $9,000.

Option 2: Take advantage of a whole house rebate program that the consumer's utility is offering and simultaneously upgrade multiple systems in the house. The upgrades include increasing ceiling insulation, replacing ductwork, converting the natural gas-powered space heating furnace and electric air conditioner to electric-powered air source heat pumps, and providing enough annual energy to power the heat pump using a photovoltaic system.

In this example, the following assumptions apply:
The consumer's annual natural gas bill is $600, 60 percent of which is for space heating. The natural gas price is $1 per therm.
The existing furnace has an efficiency of 80 percent and the existing ductwork has an efficiency of 78 percent.
Adding four inches of insulation to the 1,100 ft² ceiling, to increase the R-Value from 13 to 26, will cost $300.
Photovoltaic power production costs $4,000 per $kW_{DC}$, produces 1,400 $kWh/kW_{DC}$-yr, and qualifies for a 30-percent federal tax credit.
The heat pump proposed in Option 2 has a Heating Season Performance Factor (HSPF) of 9 Btu/Wh and a Seasonal Energy Efficiency Ratio (SEER) identical to the existing air conditioner. The heat pump will cost $10,000.
The ductwork proposed in Option 2 will be 97 percent efficient and will cost $3,000.
The consumer will receive a $4,000 rebate from the utility for the whole house upgrade under Option 2.

Analysis of the options requires determining the overall thermal characteristics of the existing building, evaluating the effects of switching fuel sources, comparing furnace efficiency, and determining fuel requirements. For purposes of illustration, the calculation in the example will only include the heating characteristics.

In this example, the consumer performed the empirical approach described supra with reference to FIG. 4 to empirically estimate overall thermal performance of a building and determined that the $UA^{Total}$ for his house was 450. Option 2 presents multiple changes that need to be considered. First, Option 2 would require switching fuels from natural gas to electricity. Assume conversion factors of 99,976 Btu per therm and 3,412 Btu per kWh. Converting current energy usage, as expressed in therms, to an equivalent number of kWh yields:

$$Q^F = (600\ therms)\left(\frac{99,976\ Btu}{therm}\right)\left(\frac{1\ kWh}{3,412\ Btu}\right) = 17,581\ kWh \quad (28)$$

Second, the heat pump is 264 percent efficient at converting electricity to heat. The equivalent furnace efficiency $\hat{\eta}^{Furnace}$ of the heat pump is:

$$\hat{\eta}^{Furnace} = \left(\frac{9\ Btu}{Wh}\right)\left(\frac{1,000\ Wh}{kWh}\right)\left(\frac{1\ kWh}{3,412\ Btu}\right) = 264\% \quad (29)$$

Third, the annual amount of electricity required to power the heat pump can be determined with Equation (42), as further described infra, with the superscript changed from 'F' (for natural gas fuel) to 'E' (for electricity):

$$\hat{Q}^{E-Heating} = (0.6)(17,581)\left[1 - \frac{\left(\frac{1}{13} - \frac{1}{26}\right)(1,100)}{450}\right]\left(\frac{0.80}{2.64}\right)\left(\frac{0.78}{0.97}\right) \quad (30)$$

$$= 2,351\ kWh$$

Fourth, in addition to switching from natural gas to electricity, the consumer will be switching the source of the fuel from utility-supplied electricity to on-site photovoltaic power generation. The number of kW$_{DC}$ of photovoltaic power required to provide 2,329 kWh to power the heat pump can be found as:

$$PV \text{ Capacity Required} = \frac{2,351 \text{ kWh/yr}}{1,400 \text{ kWh/yr}} = 1.68 \text{ kW}_{DC} \qquad (31)$$

Expected photovoltaic production can be forecast, such as described in commonly-assigned U.S. Pat. Nos. 8,165,811; 8,165,812; 8,165,813, all issued to Hoff on Apr. 24, 2012; U.S. Pat. Nos. 8,326,535 and 8,326,536, issued to Hoff on Dec. 4, 2012; U.S. Pat. No. 8,335,649, issued to Hoff on Dec. 18, 2012; U.S. Pat. No. 8,437,959, issued to Hoff on May 7, 2013; U.S. Pat. No. 8,577,612, issued to Hoff on Nov. 5, 2013; and U.S. Pat. No. 9,285,505, issued Mar. 15, 2016, the disclosures of which are incorporated by reference.

Finally, as shown in Table 1, Option 2 will cost $14,025. Option 1 is the minimum unavoidable cost of the two options and will cost $9,000. Thus, the net cost of Option 2 is $5,025. In addition, Option 2 will save $360 per year in natural gas bills because 60-percent of the $600 natural gas bill is for space, which represents a cost avoided. As a result, Option 2 has a 14-year payback.

TABLE 1

| Item | Cost | Incentive | Combined Cost |
|---|---|---|---|
| Increasing Ceiling Insulation | $ 300 | | |
| Replace Ductwork | $ 3,000 | | |
| Electric-Powered Air Source Heat Pump (Added Cost) | $10,000 | | |
| Photovoltaic Power Generation (1.68 kW$_{DC}$ @ $4,000 per kW$_{DC}$) | $ 6,720 | | |
| Tax Credit for Photovoltaic Power Generation | | ($1,995) | |
| Utility-Offered Whole House Rebate | | ($4,000) | |
| Total | $20,020 | ($5,995) | $14,025 |

A building's overall thermal performance can be used to quantify annual energy consumption requirements by fuel type. The calculations described supra assumed that energy prices did not vary with time of day, year, or amount of energy purchased. While this assumption is approximately correct with natural gas and gasoline consumption, electricity prices do vary, with electric rate structures often taking into consideration time of day, year, amount of energy purchased, and other factors.

Overall thermal performance, annual fuel consumption, and other energy-related estimates can be combined with various data sets to calculate detailed and accurate fuel consumption forecasts, including forecasts of electric bills. The fuel consumption forecasts can be used, for instance, in personal energy planning of total energy-related costs C$^{Total}$, as well as overall progress towards ZNE consumption.

Figure 7:
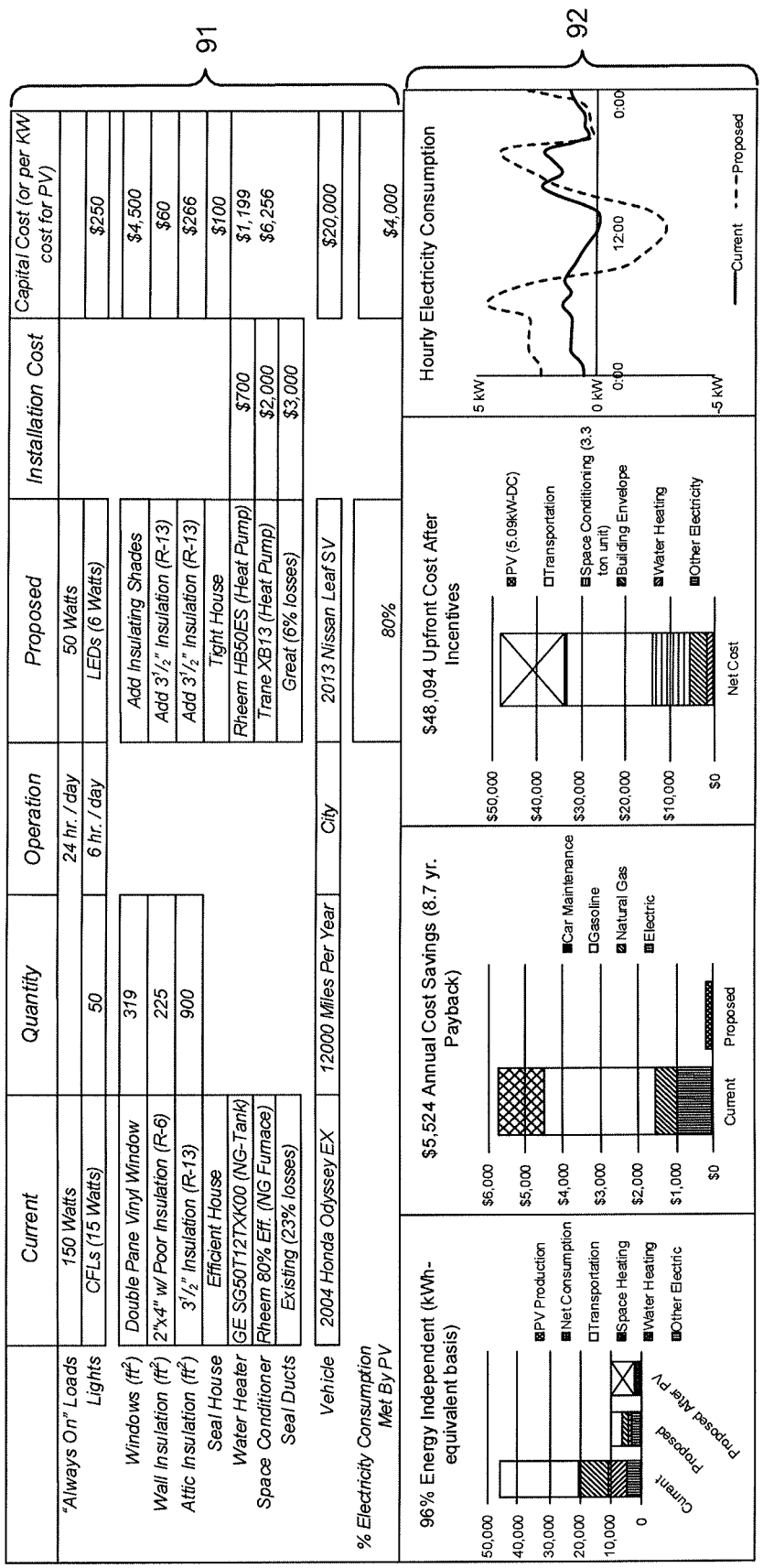
FIG. 7 is a screen shot showing, by way of example, an analysis of energy investment choices.

FIG. 7 is a screen shot showing, by way of example, the graphical user interface (GUI) 90 of an energy investment choices analysis tool. Total energy-related costs C$^{Total}$ include electricity cost (C$^E$), fuel for heating cost (C$^F$), gasoline (or other automobile fuel) cost (C$^G$), and maintenance cost (C$^M$), as described supra with reference to Equation (1), or for other energy planning purposes. Through the upper section 91 of the GUI 90, a user can select current and planned energy-related equipment and parameters. As applicable, the equipment and parameters are evaluated in light of current energy data, including consumption data, building thermal characteristics, and historical solar resource and weather data, from which proposed energy data can be generated as investment analysis results in the lower section 92 of the GUI 90.

Figure 8:
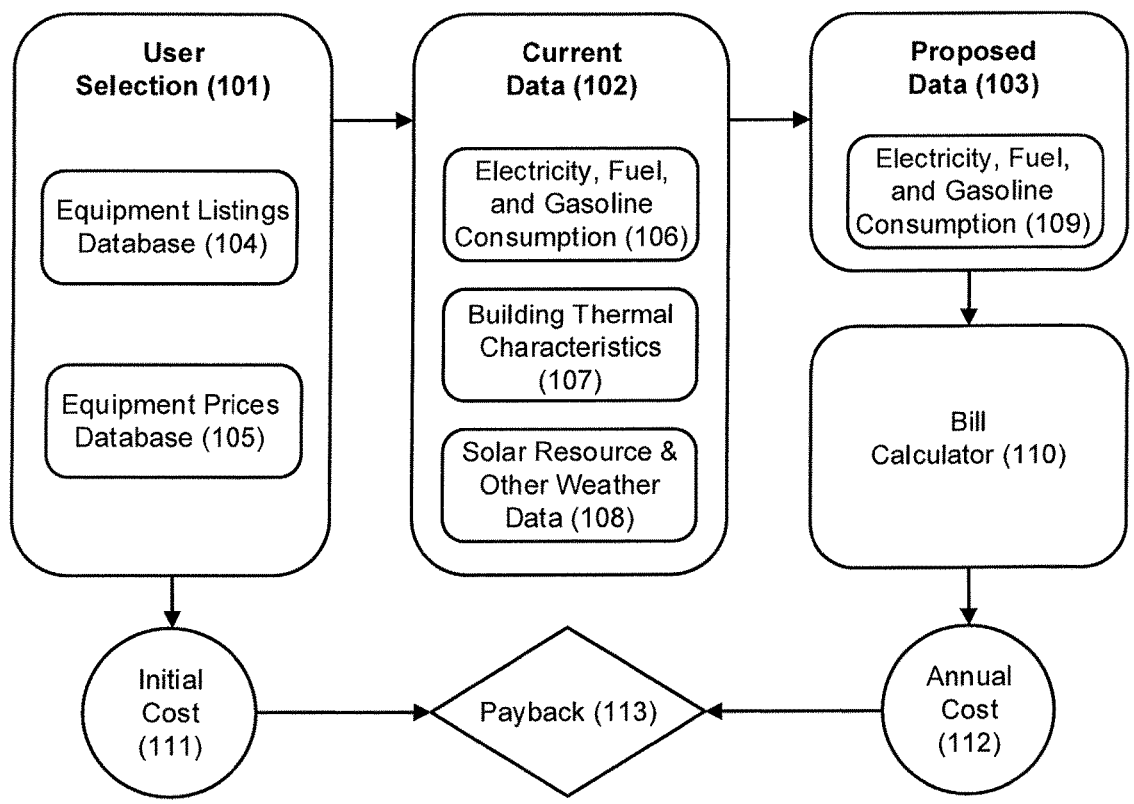
FIG. 8 is a process flow diagram showing a computer-implemented method for evaluating potential energy investment scenarios from a user's perspective, in accordance with one embodiment.

The forecasts can be used to accurately model one or more energy-related investment choices, in terms of both actual and hypothesized energy consumption and, in some cases, on-site energy production. The energy investment choices analysis tool of FIG. 7 can be implemented through software. FIG. 8 is a process flow diagram showing a computer-implemented method 100 for evaluating potential energy investment scenarios from a user's perspective, in accordance with one embodiment. Execution of the software can be performed on a computer system, such as further described infra with reference to FIG. 14, as a series of process or method modules or steps. The user interactively inputs energy-related investment selections and can view analytical outputs through a graphical user interface.

As an initial step, using the GUI 90, a user makes selections 101 of energy-related equipment investments and parameters in the form of energy-consuming or (on-site) energy-producing equipment that are currently owned or that are under consideration for acquisition. The analysis tool helps the user to explore the various aspects of the total energy-related costs C$^{Total}$ in terms of price and quantity, as described supra with reference to Equation (2). If the user is interested in just determining incurred capital cost or forecasting an electric bill, the user need only enter information about existing equipment. If an energy equipment investment is being considered, the user will need to select both the equipment currently in use and the equipment proposed to replace or upgrade the current equipment. Note that the term "equipment" as used in the context of the analysis tool non-exclusively includes multi-component systems, machinery, fixtures, appliances, and building structure, materials and components, any of which could form the basis of an energy-related investment. Additionally, the term "parameters" refers to aspects of an investment related more to operational use, than to the nature of the equipment proper. For instance, energy consumption of a fixture, such as lighting, may be reduced by parametrically decreasing the hours of operation, in addition to (or in lieu of) choosing a more energy-efficient form of lighting fixture.

A pair of databases respectively store listings of equipment 104 and their prices 105. The two databases 104, 105 could be combined into a single database. In addition, the information stored in the two databases 104, 105 is expected to be continually evolving and can be supplemented or revised with new data through automatic or manual updates, which allows the analysis tool to model personal energy-related equipment that is new to the market and other kinds of changes.

Each listing in the equipment database 105 lists a type of equipment and the type of fuel used, including, for example, electricity, heating gas or oil, gasoline (or diesel), or solar. The user makes selections of equipment for both current and proposed personal equipment investments. Each equipment listing also includes energy-related characteristics, including classifying each listed equipment as affecting one or more of personal electricity cost, heating cost, transportation cost, or maintenance cost; and an energy affect that can be quantitatively expressed as measures of one or more of personal energy-consumption, energy-conservation, or (on-site)

energy-production. For instance, a non-EV (electric vehicle) car consumes gasoline (or diesel) and the energy affect can be expressed as average miles per gallon. The annual or periodic cost of fuel can thus be projected by multiplying annual or periodic mileage by the average miles per gallon. Note that some types of equipment neither consume nor produce energy, such as different kinds of building envelope investments, which indirectly conserve energy by preventing infiltration of ambient conditions. However, their energy-related affect can be indirectly expressed based on insulative contributions to a building envelope, from which a cost (or savings) can be derived. As well, each equipment listing specifies energy-related and general characteristics that include, as applicable, name; model number; model year; fuel type: and energy (fuel) consumption, conservation or production characteristics, operational parameters, and other related performance specifications. Equipment information for energy investments that specifically affect building envelope, furnace, and heat delivery and suitable for use in the equipment database 105 is described infra with reference to FIG. 12). Other equipment information could also be included in each listing. The equipment database 105 can include:

1. Electricity-related equipment investments, including lighting, appliances, and other devices that consume electricity.
2. Building envelope equipment investments, including windows, window shades, ceiling and wall insulation, radiant barriers, roof ridge vents, and other fixtures that conserve energy within a building envelope.
3. Space conditioning equipment investments, including natural gas furnaces, air conditioning units, heat pumps, stand-alone heaters, and other units that consume energy for space conditioning.
4. Water heating equipment investments, which can either be units that consume energy or conserve energy for heating water.
5. Vehicle and transportation equipment investments, which can be conveyances or use of conveyances that consume energy for transportation, conserve energy for transportation, or both, as in the case of a hybrid automobile.
6. On-site energy producing equipment investments relating to source of electricity, including photovoltaic power generation, or, less commonly, small wind, small hydroelectric, or other distributed or standalone power generation technologies, all of which produce electricity.

Other types of equipment are possible.

Each listing of price in the equipment prices database 105 corresponds to a listing of equipment in the equipment database 105 and includes, as applicable, cost of acquisition, whether by purchase, lease, rental, or other form; installation cost; maintenance cost; costs of ownership, such as annual registration, emissions compliance, and taxes; rebates, discounts, or other incentives; and, optionally, current valuation, such as depreciated value, residual value, resale value, trade-in value, or salvage value. Other price information could also be included.

Based upon the types of energy-related investments selected, up to three sets of current data 102 may be maintained. First, for all investments, electricity, fuel, and gasoline consumption data 106 are collected for each equipment selection 101 for a recent time period, which will generally be for the past year. The consumption data 106 is formed into time series, which is particularly important for electricity and fuel, specifically, fuel used for space conditioning and water heating. The source, quantity, and type of consumption data will depend upon the nature of the equipment selection. For instance, net electricity consumption is available from power utility bills, although the amount of electricity consumed for a particular purpose, such as space or water heating, would need to be identified or estimated from net consumption. Fuel consumption depends upon the form of delivery. Bulk fuels, such as heating oil, are delivered en masse to an on-site tank; for analysis purposes, consumption can be equated to amount purchased. Consumption of metered fuels, like natural gas, is also available from fuel bills and, like electricity, use for a specific purpose, may need to be identified or estimated, such as described supra with reference to Equation (10) for the case of fuel for space heating. Gasoline (or diesel) consumption can be estimated by dividing annual miles driven by average miles per gallon, or similar metric.

Second, when the proposed energy investments relate to changes to the building's thermal envelope, the thermal characteristics 107 of the building are collected. The overall thermal properties of a building ($UA^{Total}$) may already be available from an energy audit, or could be determined using the empirical approach described supra with reference to FIG. 4.

Third, when the proposed energy investments relate to on-site energy production, historical solar resource, if photovoltaic energy production is being considered, and weather data 108 are collected for the same recent time period as the consumption data 106. In addition, if necessary, the historical solar resource and weather data 108 are converted into time series using the same time resolution as applicable to the consumption data 106. Weather data can be obtained from weather reporting services. Solar resource data is discussed in further detail infra. The equipment selections 101 are combined with the current data 102 to generate proposed data 103 for indicating annual consumption 109, by fuel type, which are calculated for both the equipment currently in use and the equipment proposed for use to replace or upgrade the current equipment. Fuel consumption and gasoline (or diesel) consumption are converted into electricity-equivalent units, as further described infra. The electricity consumption time series data is submitted to a bill calculator 110 and is combined with electric rate structure information to calculate an estimated annual cost 112. The estimated annual cost 112 is combined with the electricity-equivalent units to forecast a total annual cost, and the initial capital cost is compared to the total annual cost to determine an estimated system payback 113.

Figure 9:
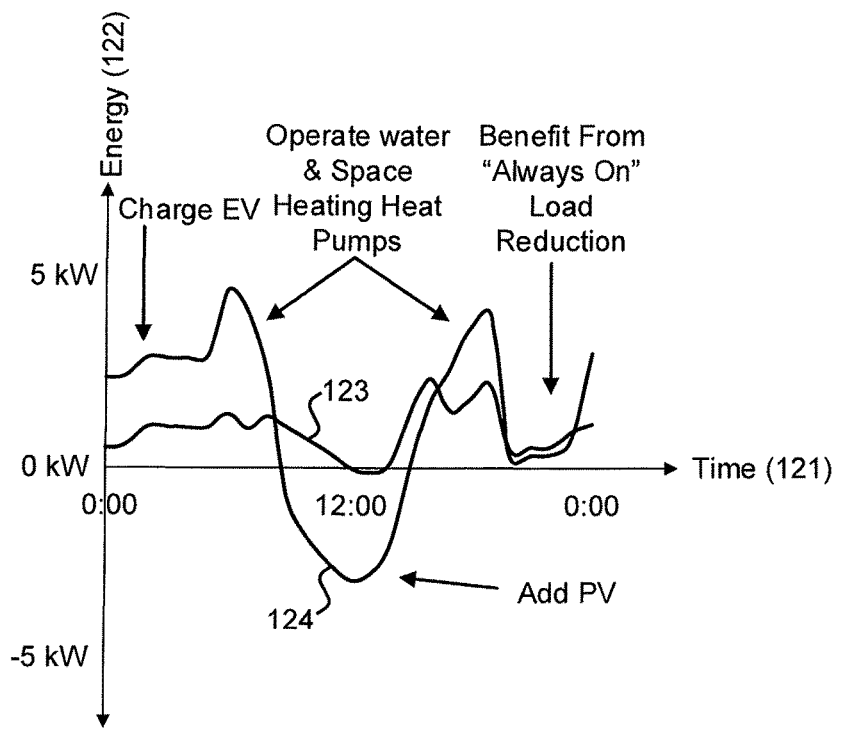
FIG. 9 is a detail of the graphical user interface of FIG. 7 showing, by way of example, an annotated graph of hourly electricity consumption.

From a non-technical person's perspective, a sufficient amount of information is presented in a single screen to help a consumer in making informed energy investment decisions. FIG. 9 is a detail of the GUI 90 of FIG. 7 showing, by way of example, an annotated graph 120 of power consumption. The x-axis 121 represents time. They-axis 122 represents power, expressed in kW. Both current power consumption 123 and proposed power consumption 124 are depicted, respectively based on the electricity demand profiles for the current and proposed investments. Proposed power consumption 124 reflects the effect of electric vehicle ("EV") charging; operation of water and space heating pumps; efficiency investments in the form of load reduction achieved by replacing existing constant load, "Always On" electric devices with more energy efficient electric devices and modifying operating schedule parameters; and fuel switching from natural gas, supplemented with on-site photovoltaic power generation.

Figure 10:
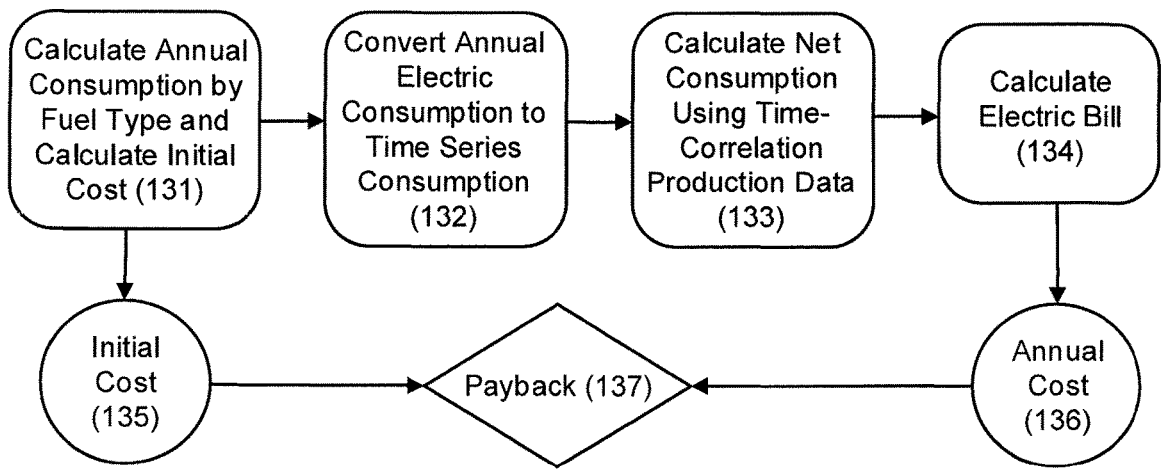
FIG. 10 is a process flow diagram showing a routine for evaluating potential energy investment payback for use in the method of FIG. 8.

The effects current and proposed energy investments are ultimately reflected as a payback on investment, which helps provide a consumer with both answers on personal energy consumption and an understanding what options and alternatives work best for the consumer's energy needs. FIG. 10 is a process flow diagram showing a routine 130 for evaluating potential energy investment payback for use in the method 100 of FIG. 8. The process uses the equipment selections 101 in combination, as applicable, with current electricity, fuel, and gasoline consumption data 106; building thermal characteristics 107; and historical solar resource and weather data 108.

By way of example, potential energy investments that affect electricity cost ($C^E$), fuel for heating cost ($C^F$), and gasoline (or other automobile fuel) cost ($C^G$), per Equation (1), as discussed supra, are modeled, but other costs, including maintenance cost ($C^M$), could also be weighed in the evaluation of total energy-related costs $C^{Total}$. Initially, as applicable, an initial capital cost 135, as discussed supra, and annual consumption, by fuel type, are calculated (step 131). The annual consumption values are determined for both the equipment currently in use and the equipment proposed to replace or upgrade the current equipment. In this example, the total energy-related costs $C^{Total}$ include gasoline (or other automobile fuel) cost ($C^G$), so the energy consumed by the person's mode of transportation is determined. This example assumes that the form of transportation is a personal car. Other forms of transportation are possible, such as trains, buses, bikes, walking, and so forth.

TABLE 2

| Vehicle Fuel Consumption | | |
|---|---|---|
| | Current | Proposed |
| Annual Mileage | 12,000 | 12,000 |
| Miles Per Gallon | 16 | 129 |
| Vehicle Is Included In Analysis? | TRUE | TRUE |
| Gasoline Consumption (gallons peryear) | 750 | 93 |
| Miles Per kWh | 0.47 | 3.83 |
| Electricity Consumption (kWh peryear) | 25,275 | 3,135 |
| Vehicle Is Electric Powered? | FALSE | TRUE |
| EV Charging Efficiency | N/A | 85% |
| Electricity Purchases (kWh-eq. peryear) | 25,275 | 3,688 |
| Gasoline Purchases (gallons peryear) | 750 | 0 |
| Electricity Purchases (kWh peryear) | 0 | 3,688 |

Referring to Table 2, the consumer currently drives a 2004 Honda Odyssey EX minivan about 12,000 miles per year primarily for city driving. For this type of usage, the vehicle has a stated fuel economy of 16 miles per gallon and will consume 750 gallons of gasoline annually. There are 33.7 kWh of energy per gallon of gasoline, so the vehicle's annual fuel consumption represents an electricity-equivalent of 25,275 kWh annually.

The consumer is proposing to replace the current vehicle with a 2013 Nissan Leaf SV, which is plug-in charging all-electric vehicle. The Leaf SV achieves a gasoline-equivalent of 129 miles per gallon for city driving, which converts to 3.8 miles per kWh. An inefficiency occurs when the vehicle is charged, which can be assumed to be around 15 percent. For the same type of usage, about 12,000 miles per year primarily for city driving, the Leaf SV, at 3.8 kWh per mile with an 85 percent charging efficiency, would require 3,688 kWh annually, which compares quite favorably to the electricity-equivalent of 25,275 kWh used by the Odyssey EX under identical driving conditions.

Electric energy efficiency investments reduce annual electricity consumption. In every building, there is typically some percentage of electricity drawn on a continuous basis by devices that are always turned on. These constant load devices may be, for example, electric hot water heaters, clocks, electric timers for operating lights, uninterruptible power supplies for computer equipment, and appliances placed on a standby mode.

The electric load consumed by "Always On" devices can be reduced by replacing existing "Always On" electric devices with more energy efficient electric devices and modifying operating schedule parameters or by unplugging unused devices. Referring to Table 3, a reduction in "Always On" loads from 150 Watts to 50 Watts translates to a savings of 876 kWh per year [(0.15 kW−0.05 kW)×8,760 hours].

In addition, other electric efficiency investments are possible, such as energy efficient appliances and efficient lighting. In this example, replacing fifty 15-Watt CFLs with 6-Watt LEDs that are operated for only six hours per day translates to a savings of 986 kWh per year [50×(0.015 kW−0.006 kW)×(6 hours per day)×(365 days per year)].

TABLE 3

| Electrical Efficiency Savings and Capital Cost | | | |
|---|---|---|---|
| | Savings (kWh/yr) | Savings (kWh/hour) | Cost |
| Always On Loads | 876 | 0.10 | $ 0 |
| Lights | 986 | 0.11 | $250 |
| Total | 1,862 | 0.21 | $250 |

Improvements to a building can change the overall thermal performance of the building $UA^{Total}$. Improvements can affect how heat loss or gain occurs by conduction through each unique building surface and through infiltration. In Equation (42), as further described infra, these effects can be calculated by incrementally changing the building's thermal characteristics. Referring to Table 4, the house in this example has R-6 wall insulation, that is, insulation with an R-value of 6. Adding R-13 insulation increases the overall insulation to R-19. The change in $UA^{Total}$ for 225 ft² of R-19 insulation equals 26 Btu/hr-° F. [(⅙−1/19)×225]. The total of all $UA^{Total}$ changes equals 218 Btu/hr-° F.

TABLE 4

| Building Improvements | | | | | |
|---|---|---|---|---|---|
| | Current R-Value | Proposed R-Value | Area (ft²) | Cost | Change in UA |
| Wall Insulation | 6 | 19 | 225 | $ 60 | 26 |
| Attic Insulation | 13 | 26 | 900 | $ 266 | 35 |
| Window Insulation | 2 | 6.7 | 319 | $4,500 | 112 |
| | ACH @ Standard Pressure | | Volume (ft²) | Cost | |
| Seal Building | 0.25 | 0.15 | 25,500 | $ 100 | 46 |
| Total Building Improvement | | | | $4,926 | 218 |

Several ratios are calculated based on current and proposed efficiencies and $UA^{Total}$ values, as further discussed infra with reference to Equation (38), Equation (42), and Equation (43). Referring to Table 5, the efficiency ratio equals the current value divided by the proposed value. The relationship is reversed for the $UA^{Total}$ values, where the $UA^{Total}$ ratio equals the proposed $UA^{Total}$ value divided by the current $UA^{Total}$ value. The current $UA^{Total}$ value of the building is a required input and can be obtained by the empirical approach described supra with reference to FIG. 4. The efficiency ratios in Table 5 will now be discussed.

TABLE 5

Efficiencies

| | Current | Proposed | Ratio |
|---|---|---|---|
| Water Heating Energy Factor | 62% | 245% | 25% |
| Building UA (Btu/hr-° F.) | 583 | 365 | 63% |
| Duct Efficiency | 77% | 94% | 82% |
| Furnace Efficiency | 80% | 249% | 32% |
| Total Space Heating (UA * Ducts * Furnace) | | | 16% |

The Water Heating Energy Factor Ratio is used to determine the proposed total annual energy required for water heating. Current annual water heating fuel consumption was calculated using the approach summarized in Equation (12), which is 199 therms of natural gas. There are 3,412 Btu per kWh. Thus, the current consumption of fuel for water heating can be expressed as 5,820 kWh of natural gas. The proposed consumption of fuel for water heating equals 5,820 kWh times the Water Heating Energy Factor Ratio and is 1,473 kWh per year (5,820×0.25). Referring to Table 6, the installed cost for the heat pump water heater is $1,899.

TABLE 6

Water Heating

| Capital | $1,199 |
|---|---|
| Installation | $ 700 |
| Total Cost | $1,899 |

Space heating requirements are calculated in a two-step process. The sizing of the heating source is first estimated, after which cost can be determined. One approach to sizing the heating source is provided in Manual J, cited supra. However, that sizing approach does not take into account historical information about the building's consumption nor is the sizing approach dynamic.

Here, an alternate approach to sizing of the heating source is applied. First, historical fuel consumption requirements are evaluated to determine worst-day situations, rather than simply assuming worst day conditions. Second, the approach dynamically incorporates the effect of investment decisions across technologies and fuel types and their various interactions. For example, the decision to add insulating window shades reduces a building's rate of heat loss and thus reduces the required size of the space conditioning heat pump, which, in turn, reduces capital cost. This decision also reduces the total amount of heat that needs to be provided by the heat pump, which, in turn, reduces the size of the photovoltaic system needed to supply energy to the heat pump. These interactions are automatically calculated.

Referring to Table 7, the maximum daily natural gas purchased for the building in this example for space heating purposes, as determined using daily water heating consumption from Equation (12) combined with total daily natural gas purchases, was 5.71 therms. In other words, the peak day over the year analyzed required a purchase of 5.71 therms of natural gas. Based on the proposed energy investments, the building envelope and duct losses will respectively be lowered to 63 percent and 82 percent, per Table 5. The product of these two ratios is 51 percent, which means that proposed energy investments would require 2.93 therms on the worst day, assuming the same furnace efficiency, $\eta^{Furnace}$. 48,836 Btu of natural gas must be purchased per hour, given a maximum daily operation of six hours. Since the current furnace is 80 percent efficient, 39,069 Btu of heat are actually delivered per hour.

The proposed space heating source is a heat pump that has a Heating Season Performance Factor (HSPF) of 8.5 Btu/Wh, which means that the heat pump will consume 4.6 kW per hour (39,069 Btu/8,500 Btu/kWh). The rating of this heat pump can also be expressed in tons by dividing by 12,000. The cost for the heat pump equals the product of the rating, expressed in in tons, times the cost, expressed in dollars per ton, plus the fixed cost, installation cost, and ductwork cost. The total proposed space heating cost is $11,256.

TABLE 7

Space Heating Sizing

| | Current | UA Ratio * Duct Ratio | Proposed |
|---|---|---|---|
| Max Daily Consumption (therms/day) | 5.71 | 51% | 2.93 |
| Max Daily Operation (Hours) | 6 | | 6 |
| Max Hourly Operation (Btu/hour) | 95,242 | | 48,836 |
| Delivered Heat (Btu/hour) | 76,193 | | 39,069 |
| Furnace HSPF (Btu/Wh) | | | 8.50 |
| Furnace AFUE | | | 0% |
| Furnace Is Heat Pump | | | TRUE |
| Max Hourly Space Heating Consumption (kW/hr) | | | 4.60 |
| Max Hourly Space Heating Consumption (tons) | | | 3.26 |

Space Heating Cost

| | Required Tons | Cost per Ton | Cost |
|---|---|---|---|
| Capacity Cost | 3.26 | $1,000 | $ 3,256 |
| Fixed Cost | | | $ 3,000 |
| Capacity + Fixed Cost | | | $ 6,256 |
| Installation Cost | | | $ 2,000 |
| Duct Cost | | | $ 3,000 |
| Total Cost | | | $11,256 |

Installing a photovoltaic system allows a consumer to offset purchased electricity consumption with on-site power generation. In the interactive energy investment choices analysis tool, the consumer could simply explicitly size the photovoltaic system. Alternatively, the consumer can specify the percentage of purchased electricity consumption to offset by on-site power generation.

Referring to Table 8, in this example, annual consumption is estimated at 9,682 kWh. The consumer has indicated that the photovoltaic system should provide 80 percent of annual consumption, or 7,746 kWh. Historical photovoltaic power production was analyzed for the location and time period of interest. Here, a 1-kW-DC, south-facing photovoltaic system would produce 1,521 kWh per year; however, a 5.09 kW-DC photovoltaic system is needed to produce 7,746 kWh. A photovoltaic system of this capacity would cost $20,376 and would be eligible to receive 30-percent federal tax credit of $6,113.

TABLE 8

| PV System Sizing and Cost | |
| --- | --- |
| Proposed Consumption (kWh/yr) | 9,682 |
| Percent Cons. to be Supplied by PV | 80% |
| PV Supplied Energy (kWh/yr) | 7,746 |
| Historical Production (kWh/kW-DC/yr) | 1,521 |
| Required PV Size (kW-DC) | 5.09 |
| Per Unit PV Cost ($/kW) | $ 4,000 |
| Total PV Cost | $20,376 |
| Federal Tax Credit | $ 6,113 |

Referring back to FIG. 10, annual electric consumption is then converted into time series consumption (step 132), which allocates annual electric consumption into time-series values on an hourly, or other time interval, basis. For any particular end-use, the distribution of annual energy must satisfy the requirement that the sum of all 8,760 hours in a year (or all 8,784 hours in a leap year), as factored, equals 1, in accordance with:

$$\sum_{m=1}^{12} \sum_{d=1}^{28\ to\ 31} \sum_{h=1}^{24} hf_{m,d,h} = 1 \quad (32)$$

where m, d, and h respectively represent month, day, and hour; and hf represents the percent of total annual energy being consumed in a given hour. A daily factor for each month and day is defined, such that the sum of the daily factors for a particular month and day equals:

$$df_{m,d} = \sum_{Hour=1}^{24} hf_{h|m,d} \quad (33)$$

where $hf_{h|m,d}$ signifies the hourly factor for hour h, given month m and day d A new term, called normalized hourly factors, is defined, which equals the original hourly factor divided by the daily factor for that month and day, expressed as:

$$\widetilde{hf}_{h\,|m,d} = \frac{hf_{h|m,d}}{df_{m,d}} \text{ for } h = 1 \text{ to } 24 \quad (34)$$

Rearranging Equation (34) and substituting into Equation (32) yields:

$$\sum_{m=1}^{12} \sum_{d=1}^{28\ to\ 31} df_{m,d} \sum_{h=1}^{24} \widetilde{hf}_{h|m,d} = 1 \quad (35)$$

Repeat the same process to define a daily factor/monthly factor relationship:

$$\sum_{m=1}^{12} mf_m \sum_{d=1}^{28\ to\ 31} \widetilde{df}_{d\,|m} \sum_{h=1}^{24} \widetilde{hf}_{h|m,d} = 1 \quad (36)$$

The benefit of Equations (35) and (36) is that they can be used to create load profiles for which detailed hourly data is unavailable. Suppose, for example, that total daily water heating consumption is available for each day of the year, but hourly data are unavailable. In this case, the consumption profiles distribution within any given day of the year could be assumed to be the same as every other day, as would be the case if the status of the water heater was always either on or off during the same time of the day. This assumption does not require that the total water heater load be the same for every day of the year.

Here, Equation (35) simplifies to the following equation:

$$\sum_{m=1}^{12} \sum_{d=1}^{28\ to\ 31} df_{m,d} \sum_{h=1}^{24} \widetilde{hf}_h = 1 \quad (37)$$

Equation (37) can be used in the context of current Green Button natural gas data. A similar approach can be taken to define constant load profiles for a day within a given month.

Figure 11:
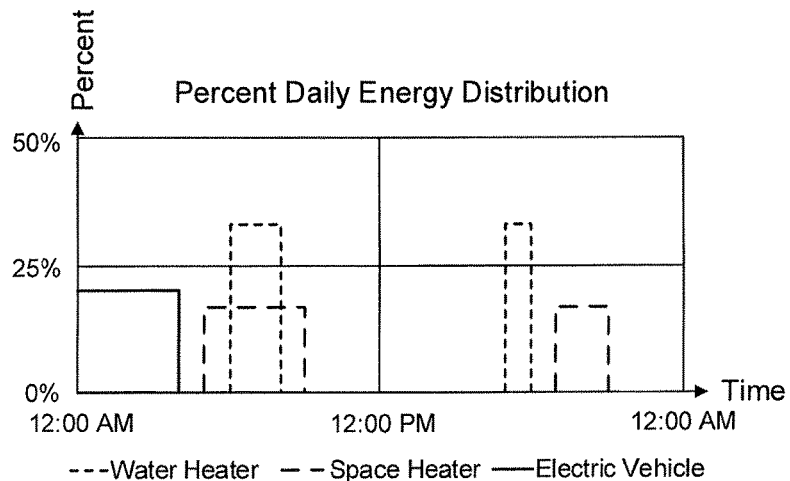
FIG. 11 is a graph depicting, by way of example, assumed hourly distribution factors, as determined by the routine of FIG. 10.

The hourly distribution factors for a proposed energy investment scenario can be depicted. FIG. 11 is a graph depicting, by way of example, assumed hourly distribution factors, as determined by the routine of FIG. 10. The x-axis represents time of day. The y-axis represents percentage. The assumed hourly distribution factors in the example for water heating, space heating, and electric vehicle charging are used in this example. Electric vehicle charging is assumed to follow the same pattern every day of the year. The daily factors for the water and space heating are based on measured natural gas purchase data. Table 9 presents projected hourly electricity consumption by end-use for one day. The columns present electricity by Other Consumption, Water Heating, Space Heating, and EV Charging. The sum of these four columns is Total Consumption.

TABLE 9

| | Projected Hourly Electricity (kWh) | | | | | | Rate Structure information | | | |
| --- | --- | --- | --- | --- | --- | --- | --- | --- | --- | --- |
| DST Start Time | Other Consumption | Water Heating | Spots Heating | EV Charging | Total Consumption | PV Production | Net Consumption | Season | Period | Rate | Cost |
| Jan. 1, 2013 12:00 AM | 0.32 | 0.00 | 0.0 | 2.02 | 2.34 | 0.00 | 2.34 | Winter | Off Peak | $0.10 | $0.24 |
| Jan. 1, 2013 1:00 AM | 0.42 | 0.00 | 0.0 | 2.02 | 2.44 | 0.00 | 2.44 | Winter | Off Peak | $0.10 | $0.25 |
| Jan. 1, 2013 2:00 AM | 0.85 | 0.00 | 0.0 | 2.02 | 2.87 | 0.00 | 2.87 | Winter | Off Peak | $0.10 | $0.29 |
| Jan. 1, 2013 3:00 AM | 0.87 | 0.00 | 0.0 | 2.02 | 2.89 | 0.00 | 2.89 | Winter | Off Peak | $0.10 | $0.29 |
| Jan. 1, 2013 4:00 AM | 0.85 | 0.00 | 0.0 | 2.02 | 2.87 | 0.00 | 2.87 | Winter | Off Peak | $0.10 | $0.29 |
| Jan. 1, 2013 5:00 AM | 0.85 | 0.00 | 2.1 | 0.00 | 2.93 | 0.00 | 2.93 | Winter | Off Peak | $0.10 | $0.30 |
| Jan. 1, 2013 6:00 AM | 1.21 | 1.35 | 2.1 | 0.00 | 4.64 | 0.00 | 4.64 | Winter | Off Peak | $0.10 | $0.47 |

TABLE 9-continued

| | Projected Hourly Electricity (kWh) | | | | | | | Rate Structure information | | |
|---|---|---|---|---|---|---|---|---|---|---|
| | Other | Water | Spots | EV | Total | PV | Net | | | | |
| DST Start Time | Consumption | Heating | Heating | Charging | Consumption | Production | Consumption | Season | Period | Rate | Cost |
| Jan. 1, 2013 7:00 AM | 0.85 | 1.35 | 2.1 | 0.00 | 4.28 | −0.21 | 4.08 | Winter | Partial Peak | $0.16 | $0.66 |
| Jan. 1, 2013 8:00 AM | 1.14 | 0.00 | 2.1 | 0.00 | 3.22 | −0.98 | 2.25 | Winter | Partial Peak | $0.16 | $0.37 |
| Jan. 1, 2013 9:00 AM | 0.83 | 0.00 | 0.0 | 0.00 | 0.83 | −1.94 | −1.11 | Winter | Partial Peak | $0.16 | ($0.18) |
| Jan. 1, 2013 10:00 AM | 0.52 | 0.00 | 0.0 | 0.00 | 0.52 | −2.63 | −2.12 | Winter | Partial Peak | $0.16 | ($0.35) |
| Jan. 1, 2013 11:00 AM | 0.22 | 0.00 | 0.0 | 0.00 | 0.22 | −3.01 | −2.79 | Winter | Partial Peak | $0.16 | ($0.46) |
| Jan. 1, 2013 12:00 PM | −0.18 | 0.00 | 0.0 | 0.00 | −0.18 | −3.07 | −3.25 | Winter | Partial Peak | $0.16 | ($0.58) |
| Jan. 1, 2013 1:00 PM | −0.32 | 0.00 | 0.0 | 0.00 | −0.32 | −2.81 | −3.13 | Winter | Partial Peak | $0.16 | ($0.51) |
| Jan. 1, 2013 2:00 PM | −0.13 | 0.00 | 0.0 | 0.00 | −0.18 | −2.21 | −2.35 | Winter | Peak | $0.27 | ($0.63) |
| Jan. 1, 2013 3:00 PM | 1.18 | 0.00 | 0.0 | 0.00 | 1.18 | −1.41 | −0.23 | Winter | Peak | $0.27 | ($0.00) |
| Jan. 1, 2013 4:00 PM | 2.11 | 0.00 | 0.0 | 0.00 | 2.11 | −0.48 | 1.62 | Winter | Peak | $0.27 | $0.43 |
| Jan. 1, 2013 5:00 PM | 1.29 | 1.35 | 0.0 | 0.00 | 2.64 | 0.00 | 2.64 | Winter | Peak | $0.27 | $0.71 |
| Jan. 1, 2013 6:00 PM | 1.60 | 0.00 | 2.1 | 0.00 | 3.68 | 0.00 | 3.68 | Winter | Peak | $0.27 | $0.99 |
| Jan. 1, 2013 7:00 PM | 1.96 | 0.00 | 2.1 | 0.00 | 4.04 | 0.00 | 4.04 | Winter | Peak | $0.27 | $1.08 |
| Jan. 1, 2013 8:00 PM | 0.24 | 0.00 | 0.0 | 0.00 | 0.24 | 0.00 | 0.24 | Winter | Peak | $0.27 | $0.06 |
| Jan. 1, 2013 9:00 PM | 0.33 | 0.00 | 0.0 | 0.00 | 0.33 | 0.00 | 0.33 | Winter | Partial Peak | $0.16 | $0.05 |
| Jan. 1, 2013 10:00 PM | 0.35 | 0.00 | 0.0 | 0.00 | 0.35 | 0.00 | 0.35 | Winter | Partial Peak | $0.16 | $0.06 |
| Jan. 1, 2013 11:00 PM | 0.72 | 0.00 | 0.0 | 0.00 | 0.72 | 0.00 | 0.72 | Winter | Off Peak | $0.10 | $0.07 |

Referring back to FIG. 10, net consumption is calculated using time-correlated production data (step 133), which requires combining time series total consumption data with time- and location-correlated production data. In many cases, photovoltaic production data may be of interest. As a result, historical photovoltaic production data needs to be simulated for the location of interest. The simulation must be performed using time- and location-correlated solar resource data, as well as specific information about the orientation and other characteristics of the photovoltaic system, such as can be provided by the SolarAnywhere® service www.solaranywhere.com, a Web-based service operated by Clean Power Research, L.L.C., Napa, Calif. The time series photovoltaic production data is subtracted from the time series consumption data to yield time series net consumption data. Photovoltaic production and net consumption for one day are presented in Table 9.

Referring finally back to FIG. 10, an electric bill is calculated (step 134), from which annual cost 136 can be forecast and upon which payback 137 can be determined. Electric bill calculation involves combining the net consumption data with the applicable electric rate structure information, including details about fixed, demand, tier, and time-of-day charges. In Table 9, the right columns present results for one day using a Pacific Gas and Electric™ EV-A tariff rate structure. Importantly, different rates can be used for "Before" and "After" calculations because a rate switch may be financially beneficial. The net consumption profile should be run through the detailed electric bill calculator for all possible rate structures to select the one that provides the greatest benefit.

Figure 12:
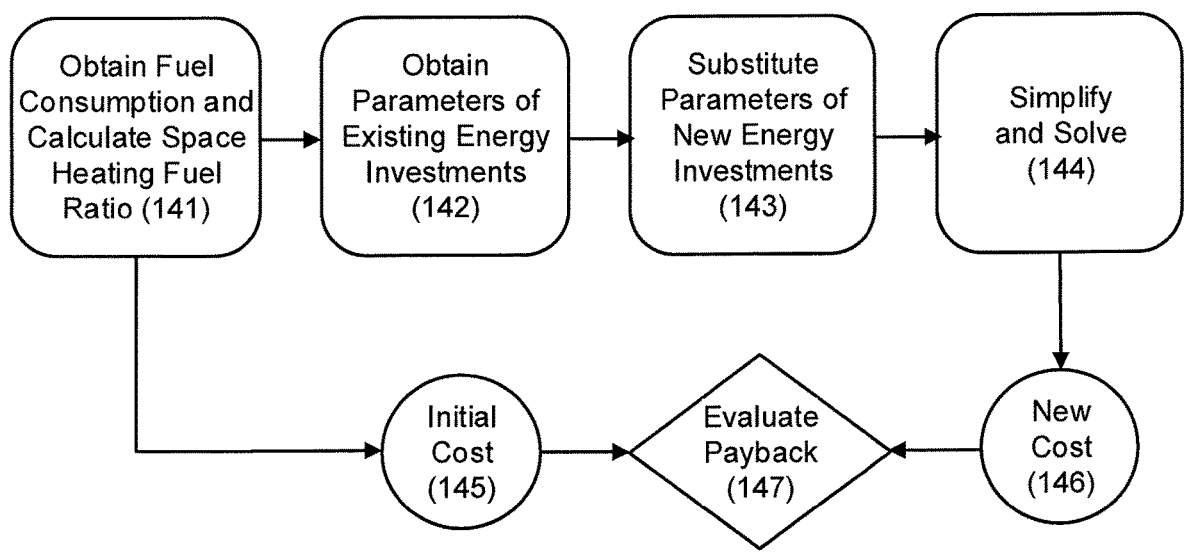
FIG. 12 is a flow diagram showing a computer-implemented method for evaluating potential energy investment scenarios specially affecting a building's envelope, heating source, or heating delivery, in accordance with a further embodiment.

The interactive energy investment choices analysis tool, described supra with reference to FIG. 7, provides a consumer with the information necessary to evaluate the economic savings or costs of new energy-related equipment investments for existing buildings. In a similar manner, energy investments that specifically affect building envelope, furnace, and heat delivery can also be evaluated. FIG. 12 is a flow diagram showing a computer-implemented method for evaluating potential energy investment scenarios specially affecting a building's envelope, heating source, or heating delivery 140, in accordance with a further embodiment. The method 140 can be implemented in software and execution of the software can be performed on a computer system, such as further described infra with reference to FIG. 14, as a series of process or method modules or steps.

Initially, the amount of total fuel purchased annually $Q^F$ is obtained, which can be found in a utility bill, and the ratio H of the amount of fuel consumed annually for heating $Q^{F\text{-}Heating}$ over the amount of the total fuel purchased annually $Q^F$ is calculated (step 141). The amount of fuel consumed annually for heating $Q^{F\text{-}Heating}$ can be derived empirically based on the fuel consumed during non-heating season months, as described supra with reference to Equation (2), or from the building's thermal performance and heating and delivery equipment characteristics, as described supra with reference to Equation (14) (step 141). The ratio H can be used to identify the initial cost 145 of the fuel consumed annually for heating based on the total cost of the fuel purchased annually.

To evaluate energy investments mainly affecting heating efficiency or delivery efficiency, a modified version of Equation (10) can be used. Depending upon the energy investments being evaluated, one or more of the existing thermal performance of the building $UA^{Total}$, existing furnace efficiency $\eta^{furnace}$ and existing delivery efficiency $\eta^{delivery}$ may be needed and can be estimated, if not available (step 142). To represent the costs after investment, each variable in Equation (10) that corresponds to a new energy investment is labeled with a caret symbol (^) (step 143). Equation (15) is substituted into the Equation (10), which is then simplified and solved (step 144) to yield the new amount of fuel used strictly for space heating $\hat{Q}^{F\text{-}Heating}$:

$$\hat{Q}^{F\text{-}Heating} = (H)(Q^F)\left(\frac{\widehat{UA}^{Total}}{UA^{Total}}\right)\left(\frac{\eta^{furnace}}{\hat{\eta}^{furnace}}\right)\left(\frac{\eta^{delivery}}{\hat{\eta}^{delivery}}\right) \quad (38)$$

Note that the variables in Equation (15) do not have caret symbols because the variables represent the values for the existing building before the investment is made. Based on $\hat{Q}^{F\text{-}Heating}$ the new cost 146 of the fuel consumed annually for heating based on the new energy-related equipment investments can be found, and the investment payback 147 can be evaluated by comparing the initial cost 145 to the new cost 146.

In Equation (38), the new amount of fuel required for heating $\hat{Q}^{F\text{-}Heating}$ equals the amount of total fuel purchased annually $Q^F$, as fractionally adjusted by the ratio H, multiplied by three additional interrelated ratios, each term in the ratio representing, as applicable, characteristics of both existing and proposed equipment:

New thermal performance of building $\widehat{UA}^{Total}$ divided by existing thermal performance of building $UA^{Total}$.

Existing furnace efficiency $\eta^{furnace}$ divided by new furnace efficiency $\hat{\eta}^{furnace}$.

Existing delivery efficiency $\eta^{delivery}$ divided by new delivery efficiency $\hat{\eta}^{delivery}$.

Equation (38) is quite useful. For example, suppose that a consumer is considering an investment in a new furnace. The existing furnace has an 80-percent efficiency $\eta^{furnace}$ and the delivery system has a 78-percent efficiency $\eta^{delivery}$. If the building had a $1,000 annual bill for fuel required for heating, Equation (38) allows the consumer to determine the fuel cost for a new 96-percent efficient furnace with 95-percent efficient ductwork. Since there is no change to the building's thermal characteristics, Equation (38) suggests that the new annual fuel cost will be $1,000×(0.80/0.96)×(0.78/0.95)=$684.

In addition to assessing the benefits associated with a new furnace and delivery system, a consumer may want to understand the effect of building envelope improvements, such as new windows or increased insulation, which can be determined by evaluating both the building's original thermal characteristics ($UA^{Total}$) and its new thermal characteristics ($\widehat{UA}^{Total}$). The typical approach to obtaining the existing and new thermal characteristics of a building is to perform a detailed energy audit that requires fully modeling the building by taking physical measurements of the surface areas of all non-homogeneous exterior-facing surfaces or verifying non-exposed surfaces. Once calculated, the existing $UA^{Total}$ is then parametrically adjusted to quantify new thermal characteristics.

Although comprehensive and customized to a specific building under consideration, there are notable weaknesses to energy audits. First, energy audits can be quite expensive, costing over a thousand dollars for the pre- and post-inspections and the filing of the necessary paperwork to obtain utility rebates.

Second, equipment problems during testing can require multiple site visits. Third, energy audit results become less valid as new energy investments are made, which change the baseline thermal characteristic findings.

Consider an alternative method. Assume that the original overall thermal characteristic $UA^{Total}$ of a building is known. $UA^{Total}$ can be determined, for instance, using the empirical approach described supra with reference to FIG. 4. Suppose that energy investments are made for only one portion of the building that only affect heat transfer through the building envelope due to conduction. For example, the building owner is considering an investment in new windows, which can be called the $j^{th}$ surface area. The new thermal characteristics of the building $\widehat{UA}^{Total}$ equal the original building characteristics $UA^{Total}$, minus the thermal characteristics of the original windows, plus the thermal characteristics of the new windows, which can be expressed as:

$$\widehat{UA}^{Total} = UA^{Total} - (U^j A^j - \hat{U}^j A^j) = UA^{Total} - (U^j - \hat{U}^j)A^j \quad (39)$$

where $U^j$ and $\hat{U}^j$ respectively represent the existing and proposed U-values of surface j, and $A^j$ represents the surface area of surface J Equation (39) can be restated in a generalized form when there are M investments being made in a building:

$$\widehat{UA}^{Total} = UA^{Total} + \sum_{j=1}^{M} (U^j - \hat{U}^j)A^j \quad (40)$$

Suppose further that energy investments are made that affect heat losses due to infiltration. As discussed supra with reference to Equation (18), infiltration losses are based on the density of air ($\rho$), specific heat of air (c), number of air changes per hour (n), and volume of air per air change (V). The volume of a building can be approximated by multiplying building square footage by average ceiling height. Equation (40) can be modified to account for "Before" and "After" infiltration heat transfer:

$$\widehat{UA}^{Total} = UA^{Total} + \sum_{j=1}^{M} (U^j - \hat{U}^j)A^j + \rho c(n - \hat{n})V \quad (41)$$

Substituting Equation (41) into Equation (38):

$$\hat{Q}^{F\text{-}Heating} = \quad (42)$$

$$(H)(Q^F)\left(1 - \frac{\sum_{j=1}^{M}(U^j - \hat{U}^j)A^j + \rho c(n - \hat{n})V}{UA^{Total}}\right)\left(\frac{\eta^{furnace}}{\hat{\eta}^{furnace}}\right)\left(\frac{\eta^{delivery}}{\hat{\eta}^{delivery}}\right)$$

Equation (42) implies that only the following information is required to quantify the energy impact of building envelope investments:

Percentage of fuel bill used for heating purposes (H), which can be obtained from monthly fuel bill data.

Existing fuel bill ($Q^F$), which can be obtained from the local utility bill records.

Existing overall thermal properties of building ($UA^{Total}$) which can be determined using the empirical approach described supra with reference to FIG. 4.

Existing furnace efficiency ($\eta^{furnace}$). This value is based on manufacturer and furnace model and is often listed directly on the furnace chassis or manufacturer specifications.

New furnace efficiency ($\hat{\eta}^{furnace}$). This value is based on manufacturer and furnace model and is often listed directly on the furnace chassis or manufacturer specifications.

Existing delivery system efficiency ($\eta^{delivery}$). This value typically ranges between 70 and 95 percent. $\eta^{delivery}$ can be estimated or can be measured directly using a duct blast (or duct leakage) test, which is a detailed, on-site test. Alternatively, delivery system efficiency can be measured empirically using temperature tests in the spaces in which the ducts are located.

New delivery system efficiency ($\hat{\eta}^{delivery}$). This value can be specified as a requirement as part of ductwork replacement. Verification involves a detailed, on-site test.

Areas of building surfaces to be replaced or upgraded. These values can be determined using a tape measure and a calculator, or software.

Existing U-values of thermal properties of building surfaces to be replaced or upgraded. These values can be estimated.

New U-values of thermal properties of building surfaces to be replaced or upgraded. These values are reported by the surface manufacturer.

Number of air changes before and after energy investment. This number is required for energy investments that affect infiltration, but not for many other building envelope-implicating energy investments. Verification involves a detailed, on-site test.

The foregoing parameters are substituted into Equation (42) (step 143), which is then simplified (step 144) to find the annual cost 146 and payback 147.

In some special cases, Equation (42) can be simplified to:

$$\hat{Q}^{F\text{-}Heating} = (H)(Q^F)\left(1 - \frac{(U^j - \hat{U}^j)A^j}{UA^{Total}}\right) \quad (43)$$

which applies when the heating source is not being replaced, the delivery system is not being upgraded, the investment does not affect the number of air changes per hour, or there is only one investment under consideration. Similar to Equation (42), the foregoing parameters are substituted into Equation (43) (step 143), which is then simplified (step 144) to find the annual cost 146 and payback 147. Consider two examples that show how Equation (43) can be used. In both examples, assume that the buildings overall thermal performance $UA^{Total}$ is 800, the natural gas bill is $1,000 annually, 60 percent of the natural gas consumed is for heating, and that natural gas costs $1 per therm.

Example: A homeowner is considering a $10,000 investment to upgrade single-pane windows with an R-value of 0.8 to triple-pane, low-e, argon gas-filled windows with an R-value of 6.7. The homeowner has 300 ft² of windows. How much would the homeowner save on heating?

The homeowner currently purchases 1,000 therms per year of natural gas based on an annual heating bill of $1,000 and natural gas price of $1 per therm. Assuming that 400 therms are for non-heating purposes, leaving 600 therms for heating. According to Equation (43), the new heating fuel consumption will be:

$$\hat{Q}^{F\text{-}Heating} = (0.6)(1,000)\left(1 - \frac{\left(\frac{1}{0.8} - \frac{1}{6.7}\right)300}{800}\right) = 352 \text{ therms} \quad (44)$$

The $10,000 investment will save the homeowner $248 per year ($1/therm)×(600 therms−352 therms).

Example: The same homeowner decided to look into a different energy investment. The home currently has a 2,500 ft² ceiling with R-6 insulation. The homeowner is considering spending $1,000 to upgrade to R-30 insulation.

According to Equation (43), the new heating fuel consumption will be:

$$\hat{Q}^{F\text{-}Heating} = (0.6)(1,000)\left(1 - \frac{\left(\frac{1}{6} - \frac{1}{30}\right)2,500}{800}\right) = 350 \text{ therms} \quad (45)$$

This $1,000 investment will save the homeowner $250 per year ($1/therm)×(600 therms−350 therms).

Figure 13:
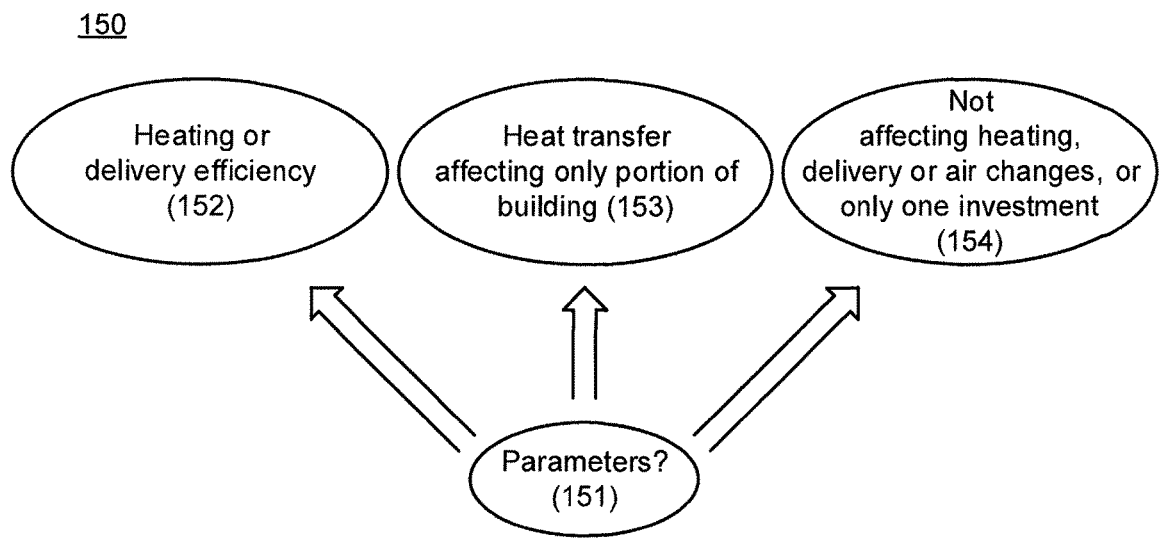
FIG. 13 is a process flow diagram showing a routine for selecting energy investment scenario parameters for use in the method of FIG. 12.

Note that Equation (38), Equation (42), and Equation (43) can all be used in the evaluation of energy investments affecting building envelope, furnace, and heat delivery. Choosing the appropriate equation depends upon the form of energy investment under consideration. FIG. 13 is a process flow diagram showing a routine for selecting energy investment scenario parameters 150 for use in the method 140 of FIG. 12. In all three cases, the annual payback 147 on fuel savings for space heating from proposed energy investments can be determined. However, depending upon the energy investment, different parameters are required and, in some cases, a simpler form of evaluation by choosing an equation requiring fewer parameters might be used (step 151). If the proposed energy investments mainly affect heating efficiency or delivery efficiency (step 152), Equation (38) is the most appropriate form of evaluation. If the proposed energy investments only affect heat transfer due to conduction through only one portion of a building, Equation (42) is better suited to the task. Finally, when the heating source is not being replaced, the delivery system is not being upgraded, the investment does not affect the number of air changes per hour, or there is only one investment under consideration, Equation (43) can be used.

Figure 14:
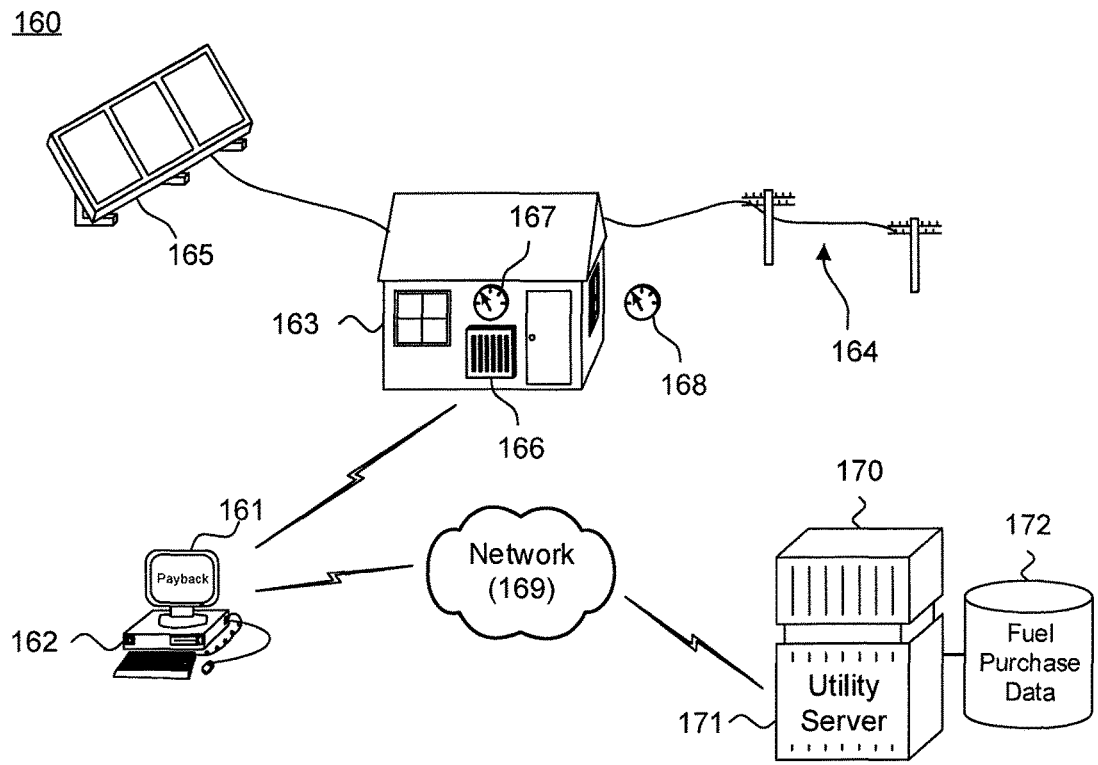
FIG. 14 is a block diagram showing a computer-implemented system 140 for empirically estimating overall thermal performance of a building through a short-duration controlled test, in accordance with one embodiment.

Fractionally inferring the percentage of the total fuel purchased for space heating purposes, as described supra with reference to FIG. 2; empirically estimating overall thermal performance of a building through a short-duration controlled test, as described supra with reference to FIG. 4; evaluating potential energy investment scenarios, as described supra with reference to FIG. 10; and evaluating new energy investments specifically affecting building envelope, heating source, or heating delivery, as described supra beginning with reference to FIG. 12, can be performed with the assistance of a computer, or through the use of hardware tailored to the purpose. FIG. 14 is a block diagram showing a computer-implemented system 160 for empirically estimating overall thermal performance of a building through a short-duration controlled test, in accordance with one embodiment, which can also be used for fractionally inferring the percentage of the total fuel purchased for space heating purposes and evaluating potential energy investment scenarios. A computer system 161, such as a personal, notebook, or tablet computer, as well as a smartphone or programmable mobile device, can be programmed to execute software programs 162 that operate autonomously or under user control, as provided through user interfacing means, such as a monitor, keyboard, and mouse. The computer system 161 includes hardware components conventionally found in a general purpose programmable computing device, such as a central processing unit, memory, input/output ports, network interface, and non-volatile storage, and execute the software programs 162, as structured into routines, functions, and modules. In addition, other configurations of computational resources, whether provided as a dedicated system or arranged in client-server or peer-to-peer topologies, and including unitary or distributed processing, communications, storage, and user interfacing, are possible.

The computer system 161 remotely interfaces to a heating source 166 and a thermometer 167 inside a building 163 that is being analytically evaluated for overall thermal performance $UA^{Total}$. In a further embodiment, the computer system 161 also remotely interfaces to a thermometer 168 outside the building 163, or to a remote data source that can provide the outdoor temperature. The computer system 161 can control the heating source 166 and read temperature measurements from the thermometer 167 throughout the short-duration controlled test, during which the baseline indoor temperature $T_0$, the starting indoor temperature $T_1$, and the final indoor temperature $T_3$ are recorded. In a further embodiment, a cooling source (not shown) can be used in place of or in addition to the heating source 166. The expected final indoor temperature $T_3^{No\ Heat}$ is also estimated by the computer system 161, based on a projection of what the indoor temperature would have been at the end of the test, had the heating source not been turned back on. The computer system 161 executes a software program 162 to determine overall thermal performance $UA^{Total}$ based on the empirical approach described supra with reference to FIG. 4.

In a further embodiment, the computer system 161 may be remotely interfaced with a server 170 operated by a power utility or other utility service provider 171 over a wide area network 169, such as the Internet, from which fuel purchase data 172 can be retrieved. The computer system 161 executes a software program 162 to fractionally infer the percentage of the total fuel purchased for space heating purposes, as described supra with reference to FIG. 2.

In a still further embodiment, the $UA^{Total}$ can be used as part of the building thermal characteristics. Optionally, the computer system 161 may also monitor electricity 164 and other metered fuel consumption, where the meter is able to externally interface to a remote machine, as well as monitor on-site power generation, such as generated by a photovoltaic system 165. The monitored fuel consumption and power generation data can be used to create the electricity, fuel, and gasoline consumption data 96 and historical solar resource and weather data 98. The computer system 161 executes a software program 162 to evaluate potential energy investment scenarios, and provide a payback estimate 137, as described supra with reference to FIG. 10.

In a yet further embodiment, the computer system 161 includes a storage device within which is stored one or more of the following data: the percentage of fuel bill used for heating purposes, an existing fuel bill, existing overall thermal properties $UA^{Total}$ of the building 163, existing furnace efficiency, new furnace efficiency, existing delivery system efficiency, new delivery system efficiency, areas of building surfaces to be replaced or upgraded, existing U-values of thermal properties of building surfaces to be replaced or upgraded, new U-values of thermal properties of building surfaces to be replaced or upgraded, and number of air changes before and after energy investment. The computer system 161 executes a software program 162 to evaluate new energy investments specifically affecting building envelope, heating source, or heating delivery, and provide a payback estimate 147, as described supra with reference to FIG. 12.

While the invention has been particularly shown and described as referenced to the embodiments thereof, those skilled in the art will understand that the foregoing and other changes in form and detail may be made therein without departing from the spirit and scope.

What is claimed is:

1. A system for empirical electrical-space-heating-based estimation of overall thermal performance of a building the aid of a digital computer, comprising:
a non-transitory computer readable storage medium comprising program code;
a thermometer located inside a building;
a thermometer located outside of the building;
at least one portable electric space heater located inside the building and configured to:
stop operating at the beginning of an unheated period;
resume operating at the end of the unheated period and continue operating for a duration of a heated period;
stop operating at the end of the heated period;
a computer processor interfaced to the storage medium, wherein the computer processor is configured to execute the program code to perform steps to:
record into the storage medium a baseline indoor temperature taken by the indoor thermometer and a baseline outdoor temperature taken by the outdoor thermometer prior to the stop of the operation of the at least one portable electric space heater at the beginning of the unheated period;
record into the storage medium a starting indoor temperature taken by the indoor thermometer at the end of the unheated period prior to the resumption of the operation of the at least one portable electric space heater;
record into the storage medium a final indoor temperature from taken by the indoor thermometer after a stabilizing period following the heated period;
measure energy consumed in the building from the beginning of the unheated period to the ending of the stabilizing period as equaling heat gained inside the building from internal sources of heat;
estimate an expected final indoor temperature at the end of the stabilizing period based on the at least one portable electric space heater not having been run for the heated period;
determine the heat gained inside the building over the heated period through operation of the portable electric space heater using the electricity requirements of the at least one portable electric space heater, the baseline indoor temperature, the final indoor temperature, the expected final indoor temperature, and the duration the heated period in accordance with:

$$Q^{Heat\ Delivered-Furnace} = (R^{Furnace})(t_2 - t_1)\left(\frac{T_0 - T_3^{No\ Heat}}{T_3 - T_3^{No\ Heat}}\right)$$

where $Q^{Heat\ Delivered-Furnace}$ is the heat gained inside the building by the at least one portable electric space heater having operated for the heated period, $R^{Furnace}$ are the electricity requirements of the portable electric space heater, $t_1$ is the starting time of the heated period, $t_2$ is the ending time of the heated period, $T_0$ is the baseline indoor temperature, $T_3$ is the final indoor temperature, $T_3^{No\ Heater}$ is the expected final indoor temperature; and
estimate overall thermal performance of the building using the heat gained through using the at least one portable electric space heater, the measured energy, the indoor temperatures, the baseline outdoor temperature, and the estimated final indoor temperature.

2. A system according to claim 1, wherein the computer processor is wirelessly interfaced to the at least one portable electric space heater and controls the operations of the portable electric space heater.

3. A system according to claim 1, wherein the computer processor is wirelessly interfaced to the thermometer inside the building and the thermometer outside the building.

4. A system according to claim 1, wherein the computer processor is further configured to execute the program code to perform steps to:
use the overall thermal performance of the building to analyze one or more potential energy investments into the building, wherein at least one of the energy investments is performed based on the analysis.

5. A system according to claim 4, wherein the potential energy investments affect only a portion of the building's envelope by changing that portion's conduction.

6. A system according to claim 5, wherein the computer processor is further configured to execute the program code to perform steps to:
evaluate a change to the overall thermal performance of the building if the potential energy investments are performed.

7. A system according to claim 6, wherein the changed overall thermal performance is evaluated in accordance with the equation:

$$\widehat{UA}^{Total} = UA^{Total} + \sum_{j=1}^{M}(U^j - \hat{U}^j)A^j$$

where the $\widehat{UA}^{Total}$ is the changed overall thermal performance, $UA^{Total}$ is the overall thermal performance, M is a number of the energy investments being performed on the envelope, $U^j$ and $\hat{U}^j$ respectively represent existing and proposed U-values of surface j comprised in the envelope, and $A^j$ represents the surface area of surface j.

8. A system according to claim 6, wherein the potential energy investments also affect the overall thermal performance by changing the infiltration of the building's envelope by air.

9. A system according to claim 8, wherein the changed overall thermal performance is evaluated in accordance with the equation:

$$\widehat{UA}^{Total} = UA^{Total} + \sum_{j=1}^{M}(U^j - \hat{U}^j)A^j + \rho c(n - \hat{n})V$$

wherein the $\widehat{UA}^{Total}_{Total}$ is the changed overall thermal performance, $UA^{Total}$ is the overall thermal performance, M is a number of the energy investments being performed on the envelope, $U^j$ and $\hat{U}^j$ respectively represent existing and proposed U-values of surface j comprised in the envelope, $A^j$ represents the surface area of surface j, $\rho$ is the density of the air, c is the specific heat of the air, n is the number of air changes per hour before the energy investments are performed, $\hat{n}$ is the number of air changes per hour after the energy investments are performed, and V is the volume of the air per the air change.

10. A method for empirical electrical-space-heating-based estimation of overall thermal performance of a building the aid of a digital computer, comprising:
providing a non-transitory computer readable storage medium comprising program code;
providing a thermometer located inside a building;
providing a thermometer located outside of the building;
using at least one portable electric space heater located inside the building, comprising:
stopping operations of the portable electric space heater at the beginning of an unheated period;
resuming operating the portable electric space heater at the end of the unheated period and continuing operating the portable electric space heater for a duration of a heated period;
stopping the operations of the portable electric space heater at the end of the heated period;
providing a computer processor interfaced to the storage medium, wherein the computer processor is configured to execute the program code;
recording with the computer processor into the storage medium a baseline indoor temperature taken by the indoor thermometer and a baseline outdoor temperature taken by the outdoor thermometer prior to the stop of the operation of the at least one portable electric space heater at the beginning of the unheated period;
recording with the computer processor into the storage medium a starting indoor temperature taken by the indoor thermometer at the end of the unheated period prior to the resumption of the operation of the at least one portable electric space heater;
recording with the computer processor into the storage medium a final indoor temperature from taken by the indoor thermometer after a stabilizing period following the heated period;
measuring with the computer processor energy consumed in the building from the beginning of the unheated period to the ending of the stabilizing period as equaling heat gained inside the building from internal sources of heat;
estimating with the computer processor an expected final indoor temperature at the end of the stabilizing period based on the at least one portable electric space heater not having been run for the heated period;
determining with the computer processor the heat gained inside the building over the heated period through operation of the portable electric space heater using the electricity requirements of the at least one portable electric space heater, the baseline indoor temperature, the final indoor temperature, the expected final indoor temperature, and the duration the heated period; and
estimating with the computer processor overall thermal performance of the building using the heat gained through using the at least one portable electric space heater, the measured energy, the indoor temperatures, the baseline outdoor temperature, and the estimated final indoor temperature; and
using with the computer processor the overall thermal performance of the building to analyze one or more potential energy investments into the building, wherein at least one of the energy investments is performed based on the analysis, wherein the potential energy investments affect only a portion of the building's envelope by changing that portion's conduction;
evaluating with the computer processor a change to the overall thermal performance of the building if the potential energy investments are performed, wherein the changed overall thermal performance is evaluated in accordance with $$\widehat{UA}^{Total} = UA^{Total} + \sum_{j=1}^{M}(U^j - \hat{U}^j)A^j$$

where the $\widehat{UA}^{Total}$ is the changed overall thermal performance, $UA^{Total}$ is the overall thermal performance, M is a number of the energy investments being performed on the envelope, $U^j$ and $\hat{U}^j$ respectively represent existing and proposed U-values of surface j comprised in the envelope, and $A^j$ represents the surface area of surface j.

11. A method according to claim 10, wherein the heat gained inside the building over the heated period through operation of the at least one portable electric space heater is determined in accordance with:

$$Q^{Heat\ Delivered\text{-}Furnace} = (R^{Furnace})(t_2 - t_1)\left(\frac{T_0 - T_3^{No\ Heat}}{T_3 - T_3^{No\ Heat}}\right)$$

where $Q^{Heat\ Delivered\text{-}Furnace}$ is the heat gained inside the building by the at least one portable electric space heater having operated for the heated period, $R^{Furnace}$ are the electricity requirements of the portable electric space heater, $t_1$ is the starting time of the heated period, $t_2$ is the ending time of the heated period, $T_0$ is the baseline indoor temperature, $T_3$ is the final indoor temperature, $T_3^{No\ Heater}$ is the expected final indoor temperature.

12. A method according to claim 10, wherein the computer processor is wirelessly interfaced to the at least one portable electric space heater and controls the operations of the portable electric space heater.

13. A method according to claim 10, wherein the computer processor is wirelessly interfaced to the thermometer inside the building and the thermometer outside the building.

14. A method according to claim 10, wherein the potential energy investments also affect the overall thermal performance by changing the infiltration of the building's envelope by air.

15. A method according to claim 14, wherein the changed overall thermal performance is evaluated in accordance with the equation:

$$\widehat{UA}^{Total} = UA^{Total} + \sum_{j=1}^{M}\left(U^j - \hat{U}^j\right)A^j + \rho c(n - \hat{n})V$$

wherein the $\widehat{UA}^{Total}_{Total}$ is the changed overall thermal performance, $UA^{Total}$ is the overall thermal performance, M is a number of the energy investments being performed on the envelope, $U^j$ and $\hat{U}^j$ respectively represent existing and proposed U-values of surface j comprised in the envelope, $A^j$ represents the surface area of surface j, $\rho$ is the density of the air, c is the specific heat of the air, n is the number of air changes per hour before the energy investments are performed, $\hat{n}$ is the number of air changes per hour after the energy investments are performed, and V is the volume of the air per the air change.

16. A method for empirical electrical-space-heating-based building overall thermal performance estimation the aid of a digital computer, comprising:
providing a non-transitory computer readable storage medium comprising program code;
providing a thermometer located inside a building;
providing a thermometer located outside of the building;
using at least one portable electric space heater located inside the building, comprising:

stopping operations of the portable electric space heater at the beginning of an unheated period;
resuming operating the portable electric space heater at the end of the unheated period and continuing operating the portable electric space heater for a duration of a heated period;
stopping the operations of the portable electric space heater at the end of the heated period;
providing a computer processor interfaced to the storage medium, wherein the computer processor is configured to execute the program code;
recording with the computer processor into the storage medium a baseline indoor temperature taken by the indoor thermometer and a baseline outdoor temperature taken by the outdoor thermometer prior to the stop of the operation of the at least one portable electric space heater at the beginning of the unheated period;
recording with the computer processor into the storage medium a starting indoor temperature taken by the indoor thermometer at the end of the unheated period prior to the resumption of the operation of the at least one portable electric space heater;
recording with the computer processor into the storage medium a final indoor temperature from taken by the indoor thermometer after a stabilizing period following the heated period;
measuring with the computer processor energy consumed in the building from the beginning of the unheated period to the ending of the stabilizing period as equaling heat gained inside the building from internal sources of heat;
estimating with the computer processor an expected final indoor temperature at the end of the stabilizing period based on the at least one portable electric space heater not having been run for the heated period;
determining with the computer processor the heat gained inside the building over the heated period through operation of the portable electric space heater using the electricity requirements of the at least one portable electric space heater, the baseline indoor temperature, the final indoor temperature, the expected final indoor temperature, and the duration the heated period in accordance with:

$$Q^{Heat\ Delivered\text{-}Furnace} = (R^{Furnace})(t_2 - t_1)\left(\frac{T_0 - T_3^{No\ Heat}}{T_3 - T_3^{No\ Heat}}\right)$$

where $Q^{Heat\ Delivered\text{-}Furnace}$ is the heat gained inside the building by the at least one portable electric space heater having operated for the heated period, $R^{Furnace}$ are the electricity requirements of the portable electric space heater, $t_1$ is the starting time of the heated period, $t_2$ is the ending time of the heated period, $T_0$ is the baseline indoor temperature, $T_3$ is the final indoor temperature, $T_3^{No\ Heater}$ is the expected final indoor temperature; and
estimating with the computer processor overall thermal performance of the building using the heat gained through using the at least one portable electric space heater, the measured energy, the indoor temperatures, the baseline outdoor temperature, and the estimated final indoor temperature.

* * * * *